United States Patent
Rozbicki et al.

(10) Patent No.: US 7,682,966 B1
(45) Date of Patent: Mar. 23, 2010

(54) MULTISTEP METHOD OF DEPOSITING METAL SEED LAYERS

(75) Inventors: Robert Rozbicki, San Francisco, CA (US); Bart van Schravendijk, Sunnyvale, CA (US); Tom Mountsier, San Jose, CA (US); Wen Wu, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 152 days.

(21) Appl. No.: 11/701,984

(22) Filed: Feb. 1, 2007

(51) Int. Cl.
H01L 23/535 (2006.01)
(52) U.S. Cl. .................. 438/637; 438/675; 438/687; 257/E21.169; 257/E21.175
(58) Field of Classification Search .................. 438/637, 438/675, 687; 257/E21.169, E21.175
See application file for complete search history.

(56) References Cited

U.S. PATENT DOCUMENTS

| | | | |
|---|---|---|---|
| 4,058,430 A | 11/1977 | Suntola et al. | |
| 4,492,620 A | 1/1985 | Matsuo et al. | |
| 4,588,490 A | 5/1986 | Cuomo et al. | |
| 4,609,903 A | 9/1986 | Toyokura et al. | |
| 4,622,121 A | 11/1986 | Wegmann et al. | |
| 4,737,384 A | 4/1988 | Murthy et al. | |
| 4,874,493 A | 10/1989 | Pan | |
| 4,999,096 A | 3/1991 | Nihei et al. | |
| 5,009,963 A | 4/1991 | Ohmi et al. | |
| 5,084,412 A | 1/1992 | Nakasaki | |
| 5,139,825 A | 8/1992 | Gordon et al. | |
| 5,178,739 A | 1/1993 | Barnes et al. | |
| 5,194,398 A | 3/1993 | Miyachi et al. | |
| 5,221,449 A | 6/1993 | Colgan et al. | |
| 5,281,485 A | 1/1994 | Colgan et al. | |
| 5,298,091 A | 3/1994 | Edwards, III et al. | |
| 5,378,506 A | 1/1995 | Imai et al. | |

(Continued)

FOREIGN PATENT DOCUMENTS

EP 0 692 551 A1 1/1996

(Continued)

OTHER PUBLICATIONS

Danek et al., "Barrier First Method for Single Damascene Trench Applications," Novellus Systems, Inc., U.S. Appl. No. 11/714,465, filed Mar. 5, 2007.

(Continued)

*Primary Examiner*—George Fourson
(74) *Attorney, Agent, or Firm*—Weaver Austin Villeneuve & Sampson LLP

(57) ABSTRACT

Metal seed layers are deposited on a semiconductor substrate having recessed features by a method that involves at least three operations. In this method, a first layer of metal is deposited onto the substrate to cover at least the bottom portions of the recessed features. The first layer of metal is subsequently redistributed to improve sidewall coverage of the recessed features. Next, a second layer of metal is deposited on at least the field region of the substrate and on the bottom portions of the recessed features. The method can be implemented using a PVD apparatus that allows deposition and resputtering operations. This sequence of operations can afford seed layers with improved step coverage. It also leads to decreased formation of voids in interconnects, and to improved resistance characteristics of formed IC devices.

22 Claims, 12 Drawing Sheets

U.S. PATENT DOCUMENTS

| | | | |
|---|---|---|---|
| 5,482,611 A | 1/1996 | Helmer et al. | |
| 5,622,608 A | 4/1997 | Lanford et al. | |
| 5,629,221 A | 5/1997 | Chao et al. | |
| 5,654,233 A | 8/1997 | Yu | |
| 5,656,860 A | 8/1997 | Lee | |
| 5,766,379 A | 6/1998 | Lanford et al. | |
| 5,789,027 A | 8/1998 | Watkins et al. | |
| 5,801,089 A | 9/1998 | Kenney | |
| 5,904,565 A | 5/1999 | Nguyen et al. | |
| 5,969,422 A | 10/1999 | Ting et al. | |
| 5,985,762 A | 11/1999 | Geffken et al. | |
| 6,037,257 A | 3/2000 | Chiang et al. | |
| 6,046,108 A | 4/2000 | Liu et al. | |
| 6,074,544 A | 6/2000 | Reid et al. | |
| 6,077,780 A | 6/2000 | Dubin | |
| 6,080,285 A | 6/2000 | Liu et al. | |
| 6,093,966 A | 7/2000 | Venkatraman et al. | |
| 6,099,702 A | 8/2000 | Reid et al. | |
| 6,100,200 A * | 8/2000 | Van Buskirk et al. | 438/697 |
| 6,110,346 A | 8/2000 | Reid et al. | |
| 6,114,238 A | 9/2000 | Liao | |
| 6,120,641 A | 9/2000 | Stevens et al. | |
| 6,124,203 A | 9/2000 | Joo et al. | |
| 6,126,798 A | 10/2000 | Reid et al. | |
| 6,139,712 A | 10/2000 | Patton et al. | |
| 6,147,000 A | 11/2000 | You et al. | |
| 6,156,167 A | 12/2000 | Patton et al. | |
| 6,159,354 A | 12/2000 | Contolini et al. | |
| 6,159,857 A | 12/2000 | Liu et al. | |
| 6,162,344 A | 12/2000 | Reid et al. | |
| 6,179,973 B1 | 1/2001 | Lai et al. | |
| 6,179,983 B1 | 1/2001 | Reid et al. | |
| 6,193,854 B1 | 2/2001 | Lai et al. | |
| 6,200,893 B1 | 3/2001 | Sneh | |
| 6,203,613 B1 | 3/2001 | Gates et al. | |
| 6,217,716 B1 | 4/2001 | Fai Lai | |
| 6,221,757 B1 | 4/2001 | Schmidbauer et al. | |
| 6,228,754 B1 | 5/2001 | Iacoponi et al. | |
| 6,235,163 B1 | 5/2001 | Angelo et al. | |
| 6,249,055 B1 | 6/2001 | Dubin | |
| 6,251,242 B1 | 6/2001 | Fu et al. | |
| 6,271,591 B1 | 8/2001 | Dubin et al. | |
| 6,274,008 B1 | 8/2001 | Gopalraja et al. | |
| 6,277,249 B1 | 8/2001 | Gopalraja et al. | |
| 6,280,597 B1 | 8/2001 | Kashiwada et al. | |
| 6,287,977 B1 | 9/2001 | Hashim et al. | |
| 6,333,547 B1 | 12/2001 | Tanaka et al. | |
| 6,340,435 B1 | 1/2002 | Bjorkman et al. | |
| 6,342,133 B2 | 1/2002 | D'Couto et al. | |
| 6,342,448 B1 | 1/2002 | Lin et al. | |
| 6,350,353 B2 | 2/2002 | Gopalraja et al. | |
| 6,387,805 B2 | 5/2002 | Ding et al. | |
| 6,391,785 B1 | 5/2002 | Satta et al. | |
| 6,395,642 B1 | 5/2002 | Liu et al. | |
| 6,402,907 B1 | 6/2002 | Rich | |
| 6,417,094 B1 | 7/2002 | Zao et al. | |
| 6,440,854 B1 | 8/2002 | Rozbicki | |
| 6,448,176 B1 | 9/2002 | Grill et al. | |
| 6,451,177 B1 | 9/2002 | Gopalraja et al. | |
| 6,492,262 B2 | 12/2002 | Uzoh | |
| 6,498,091 B1 | 12/2002 | Chen et al. | |
| 6,500,762 B2 | 12/2002 | Hashim et al. | |
| 6,509,267 B1 | 1/2003 | Woo et al. | |
| 6,538,324 B1 | 3/2003 | Tagami et al. | |
| 6,541,374 B1 | 4/2003 | de Felipe et al. | |
| 6,554,914 B1 | 4/2003 | Rozbicki et al. | |
| 6,559,061 B2 | 5/2003 | Hashim et al. | |
| 6,562,715 B1 | 5/2003 | Chen et al. | |
| 6,566,246 B1 | 5/2003 | de Felipe et al. | |
| 6,589,887 B1 | 7/2003 | Dalton et al. | |
| 6,605,534 B1 | 8/2003 | Chung et al. | |
| 6,607,977 B1 | 8/2003 | Rozbicki et al. | |
| 6,607,982 B1 | 8/2003 | Powell et al. | |
| 6,613,199 B1 | 9/2003 | Tobin et al. | |
| 6,642,146 B1 | 11/2003 | Rozbicki et al. | |
| 6,652,718 B1 | 11/2003 | D'Couto et al. | |
| 6,656,841 B1 | 12/2003 | Kim | |
| 6,660,622 B2 | 12/2003 | Chen et al. | |
| 6,673,716 B1 | 1/2004 | D'Couto et al. | |
| 6,706,155 B2 | 3/2004 | Morimoto et al. | |
| 6,709,987 B2 | 3/2004 | Hashim et al. | |
| 6,755,945 B2 * | 6/2004 | Yasar et al. | 204/192.3 |
| 6,758,947 B2 | 7/2004 | Chiang et al. | |
| 6,764,940 B1 | 7/2004 | Rozbicki et al. | |
| 6,784,096 B2 | 8/2004 | Chen et al. | |
| 6,790,776 B2 | 9/2004 | Ding et al. | |
| 6,841,044 B1 | 1/2005 | Ruzic | |
| 6,893,541 B2 | 5/2005 | Chiang et al. | |
| 6,905,965 B2 * | 6/2005 | Subrahmanyan et al. | 438/687 |
| 6,919,275 B2 | 7/2005 | Chiang et al. | |
| 6,943,111 B2 | 9/2005 | Lin et al. | |
| 6,949,457 B1 | 9/2005 | Fiordalice et al. | |
| 6,969,448 B1 * | 11/2005 | Lau | 204/192.17 |
| 6,992,012 B2 | 1/2006 | Haskim et al. | |
| 7,030,031 B2 | 4/2006 | Wille et al. | |
| 7,037,830 B1 | 5/2006 | Rumer et al. | |
| 7,048,837 B2 | 5/2006 | Somekh et al. | |
| 7,074,714 B2 | 7/2006 | Chiang et al. | |
| 7,135,402 B2 | 11/2006 | Lin et al. | |
| 7,186,648 B1 | 3/2007 | Rozbicki et al. | |
| 7,253,109 B2 * | 8/2007 | Ding et al. | 438/685 |
| 7,294,574 B2 * | 11/2007 | Ding et al. | 438/687 |
| 7,365,001 B2 * | 4/2008 | Yang et al. | 438/622 |
| 2002/0000382 A1 | 1/2002 | Morrissey et al. | |
| 2002/0041028 A1 | 4/2002 | Choi et al. | |
| 2002/0110999 A1 | 8/2002 | Lu et al. | |
| 2003/0034244 A1 | 2/2003 | Yasar et al. | |
| 2003/0116427 A1 * | 6/2003 | Ding et al. | 204/192.17 |
| 2003/0129828 A1 | 7/2003 | Cohen | |
| 2004/0048461 A1 | 3/2004 | Chen | |
| 2004/0134769 A1 * | 7/2004 | Wang et al. | 204/192.17 |
| 2004/0171250 A1 * | 9/2004 | Chiang et al. | 438/653 |
| 2004/0188239 A1 * | 9/2004 | Robison et al. | 204/192.3 |
| 2004/0211661 A1 * | 10/2004 | Zhang et al. | 204/192.12 |
| 2005/0006222 A1 * | 1/2005 | Ding et al. | 204/192.1 |
| 2005/0020080 A1 | 1/2005 | Chiang et al. | |
| 2005/0032382 A1 | 2/2005 | Rossman | |
| 2005/0085068 A1 * | 4/2005 | Chiang et al. | 438/637 |
| 2005/0173239 A1 * | 8/2005 | Somekh et al. | 204/192.13 |
| 2005/0211545 A1 | 9/2005 | Cerio, Jr. et al. | |
| 2005/0252765 A1 | 11/2005 | Zhang et al. | |
| 2005/0255690 A1 | 11/2005 | Chen et al. | |
| 2005/0255691 A1 * | 11/2005 | Ding et al. | 438/627 |
| 2005/0266682 A1 | 12/2005 | Chen et al. | |
| 2005/0272254 A1 | 12/2005 | Ding et al. | |
| 2006/0014378 A1 | 1/2006 | Aggarwal et al. | |
| 2006/0024953 A1 | 2/2006 | Rao et al. | |
| 2006/0030151 A1 * | 2/2006 | Ding et al. | 438/687 |
| 2006/0057843 A1 | 3/2006 | Chen et al. | |
| 2006/0207873 A1 | 9/2006 | Fu | |
| 2007/0020922 A1 * | 1/2007 | Chiang et al. | 438/637 |
| 2007/0178682 A1 | 8/2007 | Chiang et al. | |
| 2008/0190760 A1 * | 8/2008 | Tang et al. | 204/192.17 |
| 2008/0310005 A1 | 12/2008 | Tonar et al. | |

FOREIGN PATENT DOCUMENTS

| | | |
|---|---|---|
| JP | 11-186273 | 9/1999 |

OTHER PUBLICATIONS

U.S. Office Action mailed Jul. 31, 2002, from U.S. Appl. No. 09/862,539.

U.S. Office Action mailed Sep. 16, 2002, from U.S. Appl. No. 09/776,704.

U.S. Office Action mailed Apr. 22, 2002, from U.S. Appl. No. 09/776,704.

U.S. Final Office Action mailed Apr. 3, 2003, from U.S. Appl. No. 09/816,847.

U.S. Office Action mailed Oct. 4, 2002, from U.S. Appl. No. 09/816,847.

U.S. Office Action mailed Oct. 23, 2002, from U.S. Appl. No. 09/965,472.

U.S. Office Action mailed Oct. 3, 2003, from U.S. Appl. No. 10/412,562.

U.S. Final Office Action mailed Mar. 23, 2006, from U.S. Appl. No. 10/804,353.

U.S. Office Action mailed Oct. 3, 2006, from U.S. Appl. No. 10/804,353.

U.S. Office Action mailed Aug. 28, 2002, from U.S. Appl. No. 09/975,612.

U.S. Office Action mailed Jun. 15, 2004, from U.S. Appl. No. 10/289,237.

U.S. Office Action mailed Dec. 19, 2002, from U.S. Appl. No. 10/121,949.

Klawuhn et al., "Apparatus and Methods for Deposition and/or Etch Selectivity," Novellus Systems, Inc., U.S. Appl. No. 11/558,693, filed Nov. 10, 2006.

Dulkin et al., "Deposition of Thin Continuous PVD Seed Layers Having Improved Adhesion to the Barrier Layer," Novellus Systems, Inc., U.S. Appl. No. 11/473,618, filed Jun. 22, 2006.

Dulkin et al., "Method and Apparatus for Controlling Sputtered Flux in PVD Sources," Novellus Systems, Inc., U.S. Appl. No. 11/564,222, filed Nov. 28, 2006.

Kailasam et al., "Resputtering Process for Eliminating Dielectric Damage," Novellus Systems, Inc., U.S. Appl. No. 11/588,586, filed Oct. 26, 2006.

Lu et al., "An Integrated Plasma Equipment-feature Scale Model for Ionized Metal Physical Vapor Deposition", Jun. 2000, University of Illinois (16 pages).

Font et al., "Scaling of Hollow Cathode Magnetrons for Metal Deposition", Oct. 1999, University of Illinois (20 pages).

Rozbicki, R., "Methods and Apparatus for Resputtering Process that Improves Barrier Coverage," Novellus Systems, Inc., U.S. Appl. No. 11/830,777, filed Jul. 30, 2007.

Pradhan et al., "Atomic Layer Profiling of Diffusion Barrier and Metal See Layers," Novellus Systems, Inc., U.S. Appl. No. 11/807,179, filed May 24, 2007.

Juliano, D., "Selective Resputtering of Metal Seed Layers," Novellus Systems, Inc., U.S. Appl. No. 11/903,487, filed Sep. 21, 2007.

Vijayendran et al., "Gas Treatment Method and Apparatus to Improve Copper Gap Fill," U.S. Appl. No. 11/131,599, filed May 18, 2005.

Vyvoda et al., "Role of sidewall scattering in featuring profile evolution during $Cl_2$ and HBr plasma etching of silicon," J.Vac. Sci. Technol. B 18(2), Mar./Apr. 2000, pp. 820-833.

Hoekstra et al., "Microtenching resulting from specular reflection during chlorine etching of silicon," J.Vac. Sci. Technol. B 16(4), Jul./Aug. 1998, pp. 2102-2104.

Lane et al., "Feature evolution during plasma etching. II. Polycrystalline silicone etching," J.Vac. Sci. Technol. A 18(1), Jan./Feb. 2000, pp. 188-196.

Rozbicki R., "A Method of Enhancing Selectivity of Resputtering Process," Novellus Systems, Inc., U.S. Appl. No. 11/977,355, filed Oct. 23, 2007.

Pradhan et al., "Method and Apparatus for Increasing Local Plasma Density in Magnetically Confined Plasma," Novellus Systems, Inc., U.S. Appl. No. 11/807,182, filed May 24, 2007.

Kinder et al., "The Use of Ultra-High Magnetic Fields in Resputter and Plasma Etching," Novellus Systems, Inc., U.S. Appl. No. 11/807,183, filed May 24, 2007.

Dulkin et al., "Methods and Apparatus for Engineering and Interface Between A Diffusion Barrier Layer and A Seed Layer," Novellus Systems, Inc., U.S. Appl. No. 11/807,178, filed May 24, 2007.

U.S. Office Action mailed on Mar. 6, 2009 for U.S. Appl. No. 11/903,487.

U.S. Office Action mailed on Mar. 24, 2009 for U.S. Appl. No. 11/473,618.

U.S. Office Action mailed on May 5, 2009 for U.S. Appl. No. 11/588,586.

Schumacher Products, TDEAT (Tetrakis-diethylamino Titanium), Electronic Grade, www.schumacher.com/tdeat.html, printed Jun. 5, 2001, 1 page.

Sun et al., Suppression of Cobalt Silicide Agglomeration Using Nitrogen (N2+) Implantation, IEEE Electron Device Letters, vol. 19, No. 5, May 1998, pp. 163-166.

Ashanti et al., "A New Hollow-Cathode Magnetron Source for 0.10.mu.m Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16-18, 1998, VMIC Conference, pp. 91 and 93.

Jian Li and J. W. Mayer and E. G. Colgan, "Oxidation and Protection in Copper and Copper Alloy Thin Films", J. Appl. Phys. 70 (5), Sep. 1, 1991, pp. 2820-2827.

Ding et al., "Observation of Reduced Oxidation Rates for Plasma-Assisted CVD Copper Films", Mat. Res. Soc. Symp. Proc., vol. 309, 1993 pp. 445-460.

Klawuhn et al., "Ionized Physical-vapor deposition Using a Hollow-Cathode Magnetron Source for Advanced Metallization", J. Vac, Sci, Technol. A18(4), Jul./Aug. 2000, pp. 1546-1549.

M. Zinke-Allmang, "Phase Separation on Solid Surfaces: Nucleation, Coarsening and Coalescence Kinetics".

Peijun Ding, et al., "Copper Barrier, Seed Layer and Planarization Technologies," VMIC Conference, Jun. 10-12, 1997, pp. 87-92.

Tarek Suwwan de Felipe, et al., "Electrical Stability and Microstructual Evolution in Thin Films of High Conductivity Copper Alloys," IEEE, Jun. 1999, pp. 293-295.

Cho et al., "Factors Affecting Passivation and Resistivity of Cu(Mg) Alloy Film," Materials Research Society Symposium Proc. vol. 564, 1999, pp. 353-358.

Murarka et al., "Copper Metallization for ULSI and Beyond," Critical Reviews in Solid State and Materials Sciences, 1995, pp. 87-124.

Braeckelmann et al. "Integration and Reliability of Copper Magnesium Alloys for Multilevel Interconnects," IEEE, Feb. 2000, pp. 236-238.

Arcot et al., "Intermetallic Formation in Copper/Magnesium Thin Films—kinetics, Nucleation and Growth, and Effect of Interfacial Oxygen," J. Appl. Phys. 76(9), Nov. 1, 1994, p. 5161-5170.

Ding et al., "Effects of the addition of small amounts of A1 to copper: Corrosion, resistivity, adhesion, morphology, and diffusion," J. Appl. Phys. 75(7), Apr. 1994, pp. 3627-3631.

T. Suwwan de Felipe et al., "Bias-temperature stability of the Cu(Mg)/SiO.sub.2/p-Si metal-oxide-semiconductor capacitors," J. Vac. Sci. Technol. B 15(6), Nov./Dec. 1997, pp. 1987-1986.

Chen et al. "Low Temperature Plasma-Assisted Chemical Vapor Deposition of Tantalum Nitride form Tantalum Pentabromide for Copper Metallization," Jan./Feb. 1999, J. Vac. Sci. Technol., B 17(1), pp. 182-185.

Cheng et al., "Directional Deposition of Cu into Semiconductor Trench Structures Using Ionized Magnetron Sputtering," Mar./Apr. 1995, J. Vac. Sci. Technol., B 13(2), pp. 203-208.

Cho et al., "Remote Plasma-Assisted Metal Organic Chemical Vapor Deposition of Tantalum Nitride Thin Films with Different Radicals," Dec. 1998, Jpn. J. Appl. Phys., vol. 37.

Endle et al., "X-Ray Photoelectron Spectroscopy Study on TiN Films Produced with Tetrakis (dimethylamido)Titanium and Selected N-Containing Precursors on SiO.sub.2," May/Jun. 1998, J. Vac. Sci. Technol., A 16(3), pp. 1262-1267.

Green et al., "Determination of Flux Ionization Fraction Using a Quartz Crystal Microbalance and a Gridded Energy Analyzer in an Ionized Magnetron Sputtering System," Dec. 1997, Rev. Sci. Instrum., 68 (12), pp. 4555-4560.

Han et al., "Barrier Metal Properties of Amorphous Tantalum Nitride Thin Films Between Platnium and Silicon Deposited Using Remote Plasma Metal Organic Chemical Vapor Method," May 1998, Jpn. J. Appl. Phys., vol. 37 (1998), Pt. 1, No. 5A, pp. 2646-2651.

Hayden et al., "Characterization of Magnetron-Sputtered Partially Ionized Aluminum Deposition," Mar./Apr. 1998, J. Vac. Sci. Technol., A 16(2), pp. 624-627.

Hayden et al., "Helion Plasma Source for Ionized Physical Vapor Deposition," 1999, Surface and Coatings Technology, 120-121(1999), pp. 401-404.

Lee et al., "The Failure Mechanism of MOCVD TiN Diffusion Barrier at High Temperature," 1996, Mat. Res. Soc. Symp. Proc., vol. 324, pp. 279-284.

Lucovsky et al., "Formation of Thin Fims by Remote Plasma Enhanced Chemical Vapor Deposition (Remote PECVD)," Feb. 1990, in Handbook of Plasma Processing Technology, eds. Rossnagel, Cuomo and Westwood, Noyes Publications, pp. 387-408.

Musher et al., Atmospheric Pressure Chemical Vapor Deposition of Titanium Nitride from Tetrakis (diethylamido) Titanium and Ammonia, Feb. 1996, J. Electochem. Soc., vol. 143, No. 2, pp. 736-744.

Peng et al., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, J. Vac. Sci. Technol., B 16(4), pp. 2013-2018.

Reif, Rafael, Plasma Enhanced Chemical Vapor Deposition of Thin Films for Microelectronics, Feb. 1990, in Handbook of Plasma Processing Technology, eds: Rossnagel, Cuomo and Westwood, Noyes Publications, pp. 260-284.

Truong, C.M.; Chen, P.J.; Corneille, J.S.; Oh, W.S. and Goodman, D.W., "Low-Pressure Deposition of TiN Thin Films from a Tetrakis (diethylamido) Titanium Precursor," 1995, *J. Phys. Chem.*, 1995, 99, pp. 8831-8842.

Tsai et al., "Comparison of the Diffusion Barrier Properties of Chemical-Vapor-Deposited TaN and Sputtered TaN Between Cu and Si," May 1996, J. Appl. Phys., 79 (9), pp. 6932-6938.

Kailasam et al., "Resputtering Process for Eliminating Dielectric Damage," Novellus Systems, Inc., U.S. Appl. No. 11/588,586, filed Nov. 26, 2006, pp. 1-38.

Leeser et al., "Method of Depositing an Elemental Film," Novellus Systems, Inc., U.S. Appl. No. 11/498,949, filed Aug. 2, 2006, pp. 1-32.

* cited by examiner

MULTISTEP METHOD OF DEPOSITING
METAL SEED LAYERS

FIELD OF THE INVENTION

The present invention pertains to methods of depositing layers of material on a partially fabricated integrated circuit. The methods are particularly useful for depositing metal seed layers, such as copper seed layers in Damascene processing.

BACKGROUND OF THE INVENTION

Damascene processing is a method for forming metal lines on integrated circuits. It involves formation of inlaid metal lines in trenches and vias formed in a dielectric layer (inter metal dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on another metallization layer. A stack of several metallization layers can be formed using Damascene processing.

Deposition of metal in Damascene processing is often accomplished by electroplating methods. During electroplating, the wafer substrate is electrically biased to serve as a cathode. The cathode is immersed into the plating solution containing metal ions, which are reduced at the cathode surface to form a layer of electrodeposited metal. Electroplating methods require that an electrical contact is made with the wafer substrate. This is typically accomplished using metal seed layers pre-deposited on the wafer surface. In order to achieve good quality of metal deposition during electroplating, a continuous seed layer of metal should reside on the surface of the substrate. Seed layers can be deposited by several methods, of which PVD and electroless deposition are most notable.

As the dimensions of features in integrated circuits continue to shrink, deposition of continuous seed layers becomes increasingly challenging. Currently there is a need for new methods of seed layer formation, as well as for apparatus that can be used for seed layer deposition.

SUMMARY OF THE INVENTION

The present invention provides a method of depositing metal seed layers on a semiconductor substrate having recessed features. In this method, a first layer of metal is deposited onto the substrate to cover at least the bottom portions of the recessed features. The first layer of metal is subsequently redistributed to improve sidewall coverage of the recessed features. Next, a second layer of metal is deposited on at least the field region of the substrate and on the bottom portions of the recessed features. This sequence of operations can produce seed layers with improved step coverage. It also can lead to decreased formation of voids in interconnects, and consequently to improved resistance characteristics of formed IC devices. Further, improved seed layer coverage decreases undesirable impact of the terminal effect that is often encountered in subsequent electroplating operations, when excessively thin seed layers are employed. In some embodiments, provided methods can improve reliability characteristics of interconnects (such as electromigration, and stress migration), as well as lead to an improved fabrication yield.

According to one aspect of the invention, a method of depositing a metal seed layer is provided. A variety of metals and metal alloys, may be deposited by the described methods. For example, seed layers containing copper or various alloys of copper with a variety of alloying materials can be deposited. Specifically, in some embodiments, copper alloys with an alloying material selected from the group consisting of Mg, Mn, Al, Zn, Sn, Ag, Ta, and B, are deposited using provided methods. In other embodiments, the methods can be used to deposit cobalt or ruthenium seed layers.

The seed layer is deposited on a wafer substrate having a field region and recessed features, such as vias and/or trenches. In a typical Damascene process flow, the seed layer is deposited onto a layer of diffusion barrier material, such as Ta, Ti, $TaN_x$, $TiN_x$, etc. According to one embodiment, the method of forming the seed layer includes depositing a first layer of metal on at least the bottom portions of the recessed features and on the field region; subsequently redistributing the deposited metal on the wafer, at least from the bottom portions of the recessed features to the sidewalls of the recessed features; and after redistributing the deposited metal, depositing a second layer of metal (sometimes referred to as a "flash layer") on at least the field region and the bottom portions of the recessed features.

In some embodiments, an additional metal redistribution operation is performed after the flash layer has been deposited, followed by deposition of another flash layer of metal. Redistribution followed by deposition can be further repeated at least once until desired thickness and conformality of seed layer is achieved. In some embodiments the process flow may end with a redistribution operation.

In some embodiments, depositing the first and the second metal layers, is performed by iPVD metal sputtering. Redistributing operation can be performed by resputtering the first metal layer with plasma. In certain embodiments, the three operations are performed in one process chamber. Such process chamber may include a hollow cathode magnetron (HCM) or a planar magnetron.

In some embodiments, the first/and or the second metal layers may be deposited by iALD.

It is understood that thickness of deposited metal layers may differ for different technology nodes, and may depend on the sizes of the features that need to be coated.

In some embodiments, the first metal layer is deposited to a thickness of between about 200 and 1000 Å as measured in the field region. The first metal layer may be deposited in the field, on the recess sidewalls and on the recess bottoms, such as the thickness of the deposited first layer on the bottom of the recessed features is between about 20 to 100% of the thickness of the first layer deposited on the field; and the thickness of the deposited layer on the sidewalls of the recessed features is between about 10 to 20% of the thickness of the layer deposited on the field. Deposition of the first metal layer can be performed, in some embodiments, in an iPVD apparatus at a pressure of less than about 1 mTorr.

Referring now to redistribution of metal from the bottoms of the recesses to the sidewalls of the recesses, it is often desirable to perform such redistribution aggressively. In some embodiments, such redistribution involves etching metal from at least the bottom portions of the recesses, and, in some cases, it may involve etching material from the field region. In some examples, redistribution operation comprises etching more than about 20% or more than about 40% of the first metal layer from the field region. During resputter, material can be simultaneously deposited and etched in the field. In certain embodiments, resputtering has an etch rate to deposition rate (E/D) ratio of greater than about 2 in the field. Aggressive redistribution at the recess bottoms, particularly at the via bottoms can manifest itself in removal of large amounts of material. In some instances more than 50% of the first layer thickness is etched from the bottom portions of at least some of the recesses. According to some examples of aggressive redistribution, the first layer of metal is removed from the bottom portions of at least some of the recesses such that no more than about 5 Å of the first layer of metal remains in the recess bottoms.

Referring to deposition of the flash layer, such layer may be deposited, in one example, to a thickness of about 30-150 Å in the field region. It is often desirable to deposit the flash layer under conditions that promote coverage of corners within the recessed features.

The seed layer, obtained by the described methods can be characterized by improved step coverage and, consequently, leads to an improvement in quality of subsequently deposited metal fill.

According to another aspect, an apparatus for depositing a metal seed layer on a semiconductor wafer having recessed features and a field region, is provided. According to some embodiments, the apparatus includes a process chamber having a target for sputtering a metal onto the semiconductor wafer; a wafer support for holding the wafer in position during deposition of the metal; and a controller comprising program instructions for performing deposition of a seed layer. Typically, the target comprises a metal, such as copper, for forming the seed layer on the semiconductor wafer. In some embodiments, the process chamber of the apparatus may comprise an HCM or a planar magnetron.

The controller may include instructions for sputtering the metal from the target onto the semiconductor wafer under conditions that coat at least the bottom portions of the recessed features and the field region thereby forming a first layer of metal; subsequently resputtering the first layer of metal to redistribute the metal from the bottom portions of the recessed features to the sidewalls of recessed features; and subsequently sputtering the metal from the target onto the semiconductor wafer to form a second layer metal. The controller can further include instructions for generating a plasma comprising ionized material sputtered from the target. The instructions may specify parameters for a particular regime during deposition or resputtering. In some embodiments, the instructions for resputtering the first layer of metal comprise instructions for etching the first layer of metal at least at the bottom of the recessed features to remove at least about 50% of the first layer thickness. Further, the instructions for resputtering the first layer of metal may comprise instructions for removing about 20-50% of the first layer of metal from the field region. In some embodiments, the instructions for depositing the second layer of metal comprise instructions for depositing the second layer under conditions that provide coverage of the corners residing within the recessed features.

These and other features and advantages of the present invention will be described in more detail below with reference to the associated drawings.

DETAILED DESCRIPTION OF PREFERRED EMBODIMENTS

Introduction and Overview

As mentioned, methods of depositing metal seed layers are herein described. These methods can be used in a variety of applications that require deposition of thin layers of metal on a substrate having recessed features. These methods are particularly suitable for IC fabrication, and will be illustrated in the context of a copper dual Damascene processing. It is understood, that these methods can be used in other processing methods, including single Damascene processing, and can be applied to deposition of a variety of metals beyond copper. For example, aluminum, cobalt and ruthenium seed layers can be deposited using these methods. Further, a variety of alloys such as copper alloys with a number of alloying materials may be deposited Examples of alloying materials include Mg, Mn, Al, Sn, Zn, Ta, Ag, and B, to name a few. In some embodiments, the alloying material is present in a copper alloy at a concentration of a few atomic percent, e.g., in the range of about 0.5-10 atomic percent. Other seed layer materials and particular alloy compositions used in seed layer applications are well known to those of skill in the art and will not be described in further detail.

In order to frame the context of this invention, a brief description of a copper dual Damascene process for forming a partially fabricated integrated circuit is described below.

Figure 1A:
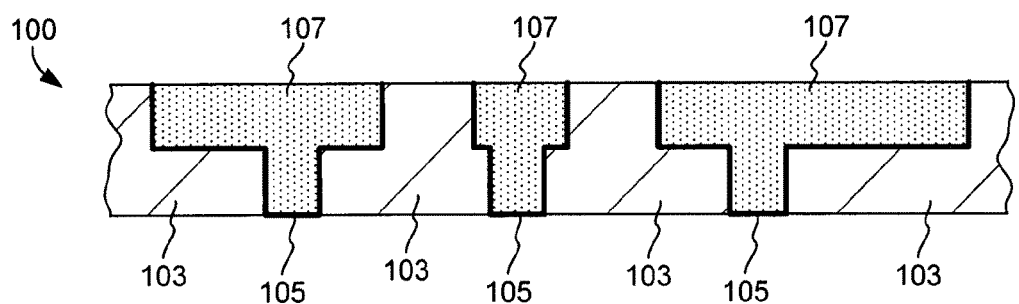
FIGS. 1A-1H show cross sectional depictions of device structures created during a copper dual Damascene fabrication process.

Presented in FIGS. 1A-1G, is a cross sectional depiction of device structures created at various stages of a dual Damascene fabrication process. A cross sectional depiction of a completed structure created by the dual Damascene process is shown in FIG. 1H. Referring to FIG. 1A, an example of a typical substrate, 100, used for dual Damascene fabrication is illustrated. Substrate 100 includes a pre-formed dielectric layer 103 (such as fluorine or carbon doped silicon dioxide or organic-containing low-k materials) with etched line paths (trenches and vias) in which a diffusion barrier 105 has been deposited followed by inlaying with copper conductive routes 107. Because copper or other mobile conductive material provides the conductive paths of the semiconductor wafer, the underlying silicon devices must be protected from metal ions (e.g., $Cu^{2+}$) that might otherwise diffuse or drift into the silicon. Suitable materials for diffusion barrier 105 include tantalum, tantalum nitride, and the like. In a typical process, barrier 105 is formed by a physical vapor deposition (PVD) process such as sputtering, a chemical vapor deposition (CVD) process, or an atomic layer deposition (ALD) process. Typical metals for the conductive routes are aluminum and copper. More frequently, copper serves as the metal in Damascene processes, as depicted in these figures. The metal lines 107 are typically deposited by electrofill methods onto a thin layer of pre-deposited seed layer (not shown). The seed layer is usually deposited by PVD and can be formed by methods that will be described herein in further detail. After fill of metal layer 107 (above the field) the excess metal is removed to the field level (as well as portions of diffusion barrier 105 on the field). This leaves metal inlay 107 exposed on the field region for construction of additional layers. The resultant partially fabricated integrated circuit 100 is a representative substrate for subsequent Damascene processing, as depicted in FIGS. 1B-1G.

Figure 1B:
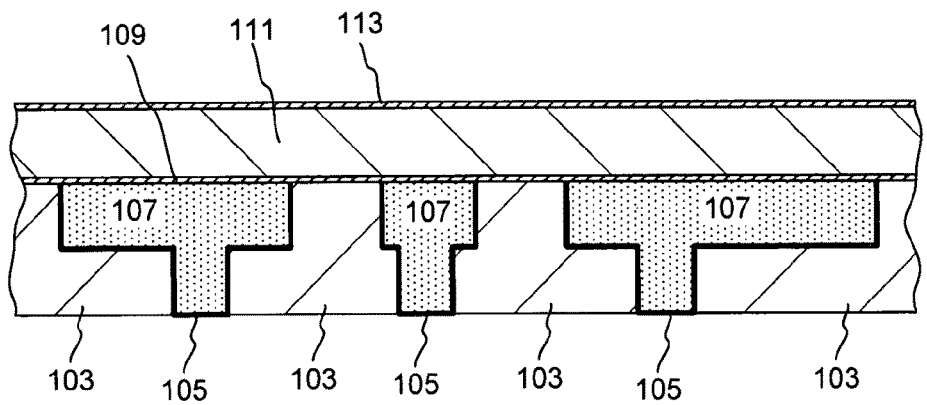

As depicted in FIG. 1B, a silicon nitride or silicon carbide diffusion barrier 109 is deposited to encapsulate conductive routes 107. Next, a first dielectric layer, 111, of a dual Damascene dielectric structure is deposited on diffusion barrier 109. The dielectric 111 is typically a low-k dielectric, such as described above for the layer 103. This is followed by deposition of an etch-stop layer 113 (typically composed of silicon nitride or silicon carbide) on the first dielectric layer 111. Layers 109, 111, and 113 can be deposited by CVD and plasma enhanced CVD (PECVD) methods from a variety of silicon, oxygen, carbon, and nitrogen containing precursors.

Figure 1C:
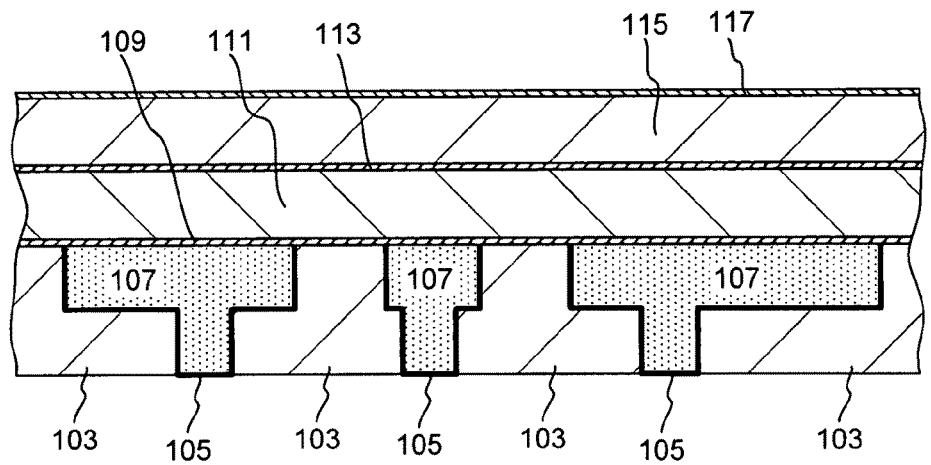

The process follows, as depicted in FIG. 1C, where a second dielectric layer 115 of the dual Damascene dielectric structure is deposited in a similar manner to the first dielectric layer 111, onto etch-stop layer 113. Deposition of an antireflective layer 117, typically containing BARC materials, follows.

Figure 1D:
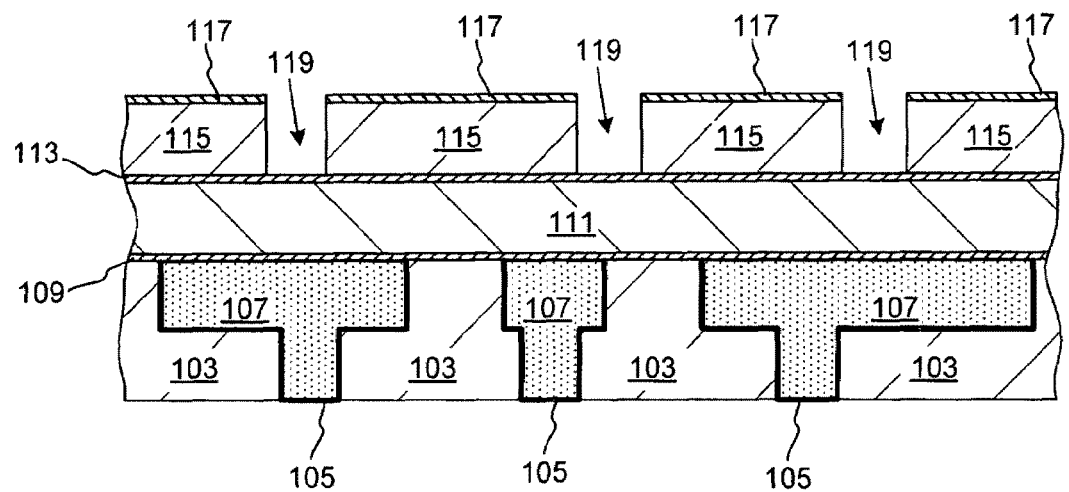
Figure 1E:
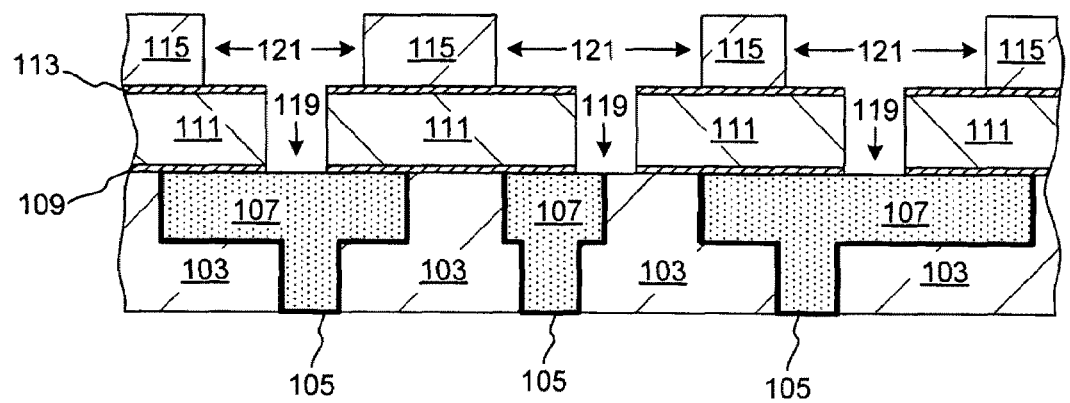

The dual Damascene process continues, as depicted in FIGS. 1D-1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
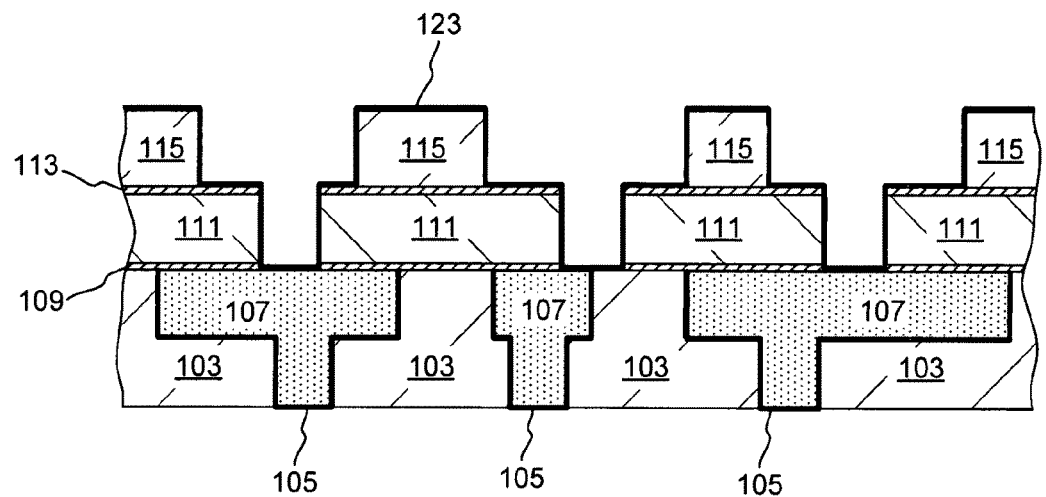

Next, as depicted in FIG. 1F, these newly formed vias and trenches are, as described above, coated with a diffusion barrier 123. In some embodiments, a preclean process, such as Ar sputter etch or reactive preclean, may be needed prior to barrier deposition in order to remove contamination at the via bottom and ensure good ohmic contact. Preclean may be skipped if Barrier First method is the chosen process flow. Examples of Barrier First process flows are described in detail in U.S. Pat. No. 6,764,940, issued on Jul. 4, 2004 naming Rozbicki et al. as inventors. This patent is herein incorporated by reference in its entirety. As mentioned above, barrier 123 is made of tantalum, or other materials that effectively block diffusion of copper atoms into the dielectric layers.

After diffusion barrier 123 is deposited, a seed layer of copper is applied (typically by a PVD process which will be described in detail) to enable subsequent electrofilling of the features with copper inlay. It is understood, that for certain seed layers, such as for certain copper alloys, diffusion barrier 123 may not be required. Such seed layers may themselves possess diffusion barrier properties and may be deposited directly onto a dielectric 115 and 111.

Figure 1G:
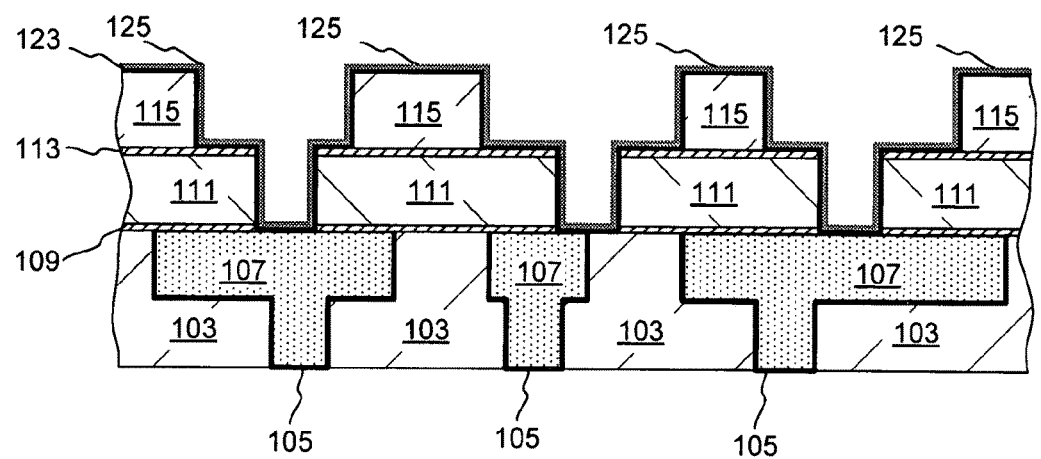
Figure 1H:
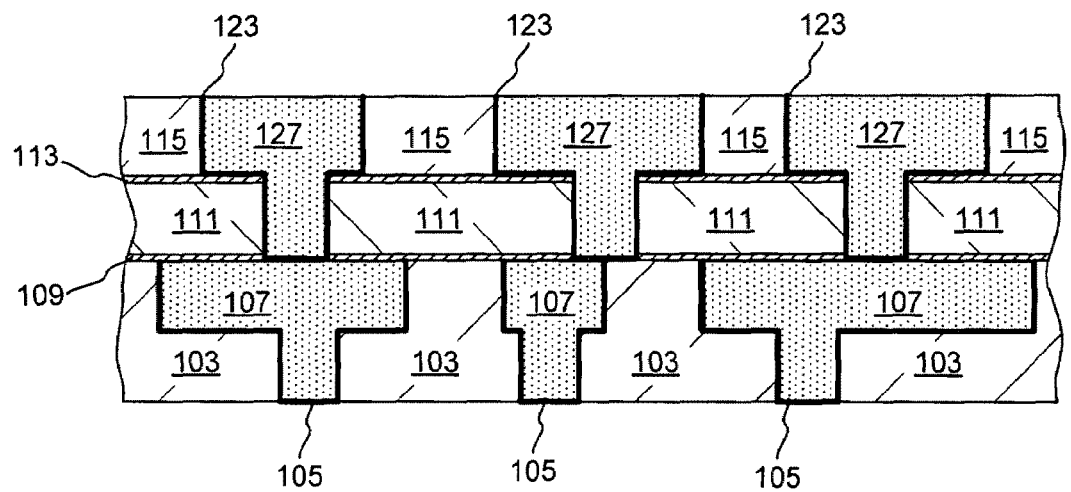

FIG. 1G depicts a copper seed layer 125 deposited on top of the diffusion barrier layer 123. The seed layer should preferably be continuous and should conformally coat the recessed features in order to support an electrofill process. Preferably, thickness of seed layer coverage should not significantly fluctuate depending on its position on the wafer. In some embodiments, it is often desirable to obtain a continuous seed layer that will have substantially the same thickness in the field, on the bottom portions of the recesses and on the sidewalls. Further, various corners within the recesses should be adequately coated by the seed metal. Methods provided herein allow deposition of seed layers with improved coverage, and result in formation of IC devices having increased reliability.

After the seed layer has been deposited, the recesses are electrofilled with copper. During electrodeposition of copper, the seed layer residing on the wafer serves as a cathode with an electrical contact being made at the edge of the wafer. In those cases when the seed layer is very thin, the sheet resistance of the seed layer is usually substantial. Electroplating on a layer with high sheet resistance gives rise to a terminal effect, in which greater amounts of copper are plated in the vicinity of the electrical contact. Terminal effect leads to increased deposition of metal at the wafer edge and to decreased deposition at the wafer center. Such non-uniformity is undesirable, and should be avoided when possible. While in some cases seed layers should necessarily be thin to serve their function, in other cases seed layers may contain inadvertently formed thin portions, which may unnecessarily exacerbate the terminal effect. It is therefore important, to avoid deposition of unnecessarily thin seed layers. Methods described herein allow good seed layer coverage in the field, especially at the edge of the wafer, in the recess bottoms, and on the sidewalls, thereby leading to smaller terminal effects during plating.

After copper has been electrodeposited, excess copper is removed from the field by, for example, chemical mechanical polishing (CMP). FIG. 1H shows the completed dual Damascene structure, in which copper conductive routes 127 are inlayed (seed layer not depicted) into the via and trench surfaces over barrier 123.

Copper routes 127 and 107 are now in electrical contact and form conductive pathways, as they are separated only by diffusion barrier 123, which is also somewhat conductive.

Figure 2:
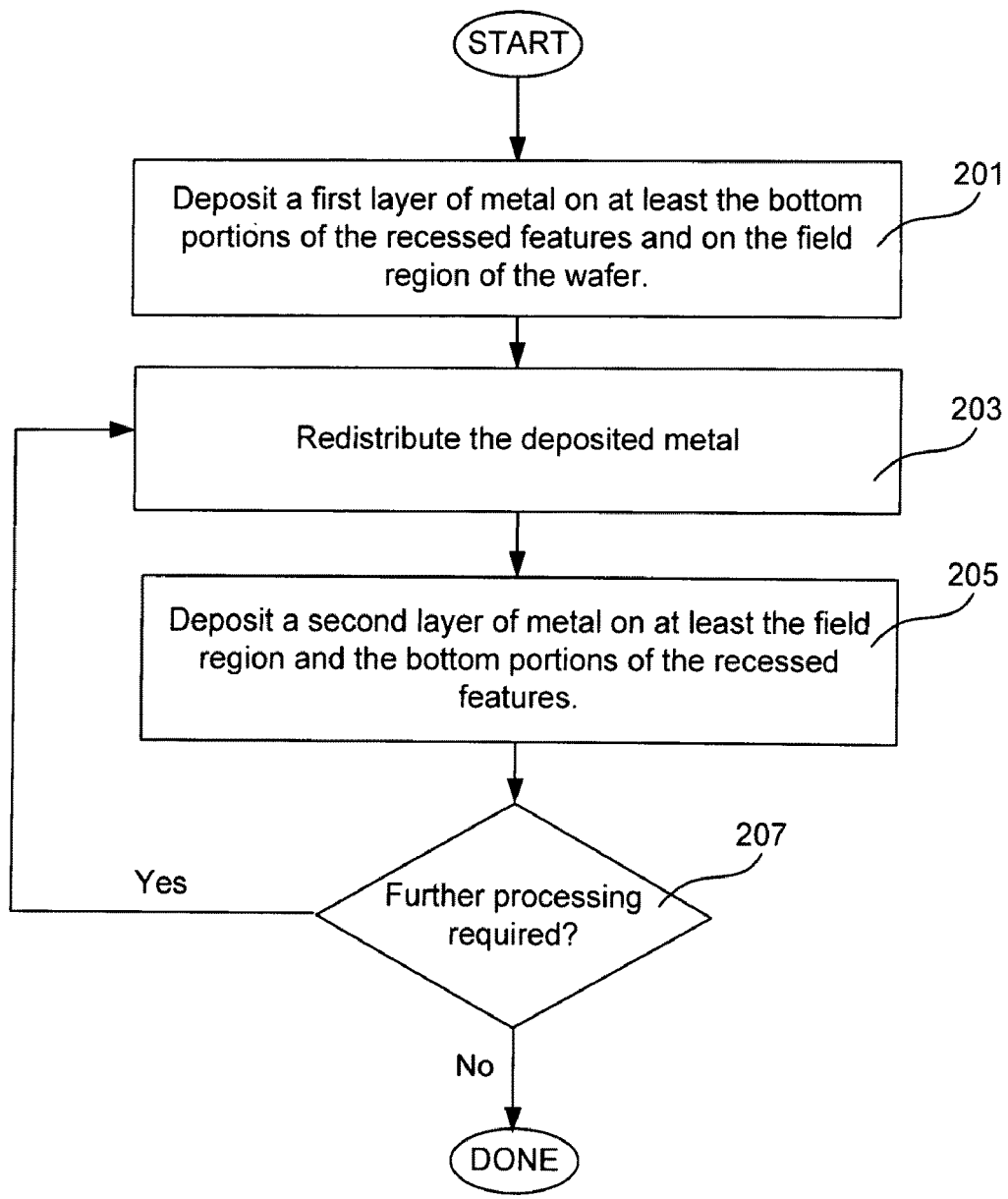
FIG. 2 presents a process flow diagram for a method of depositing a metal seed layer on a partially fabricated integrated circuit in accordance with certain embodiments of the present invention.

Methods of seed layer deposition are illustrated in a process flow diagram presented in FIG. 2 and in cross-sectional interconnect depictions presented in FIGS. 3A-3D.

Deposition of the First Layer of Metal

Referring to FIG. 2, the seed layer deposition process starts with operation 201, which deposits a first layer of metal on at least the bottom portions of the recessed features and on the field region. The first layer of metal is then redistributed on the wafer as shown in the process block 203. In one embodiment, the first layer of metal is redistributed at least from the bottom portions of the recessed features to the sidewalls of the recessed features, as shown in the process block 203. In some embodiments, when deposition of the first layer of metal generates overhang at the openings of recessed features, the redistribution operation may serve to reduce and/or reshape such overhang. Next, in an operation 205, a second layer of metal ("flash layer") is deposited on at least the field region and on the bottom portions of the recessed features.

After the flash layer has been deposited, it is determined in operation 207, whether further processing of the formed seed layer is required. For example, it may be determined whether the seed layer has been deposited to a desired thickness, or has appropriate conformality. If it is decided that no further processing is required, the process is considered to be complete. If further modification of seed layer is desired, redistribution of metal 203 and flash layer deposition 205 are repeated as many times as necessary. For example, in one embodiment, the process flows according to a scheme: deposition (D)/redistribution (R)/deposition/redistribution/deposition. In another embodiment operations 203 and 205 are further repeated at least once to provide the following process flow: D/R/D/R/D/R/D. Note that in many embodiments it is highly preferable to end the process with a deposition operation. However, multi-step processes that may end with the redistribution operation are also contemplated in other embodiments. For example, in some embodiments, D/R/D/R or D/R/D/R/D/R process flows may be used.

Figure 3A:
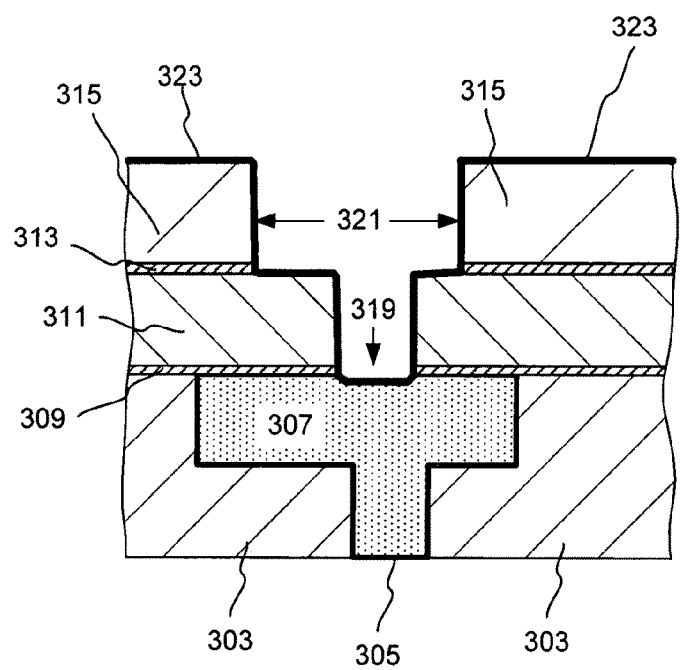
FIG. 3A shows a cross-sectional depiction of an interconnect illustrating a substrate prior to deposition of a metal seed layer.

A typical substrate for operation 201 is illustrated in FIG. 3A. The substrate illustrated in FIG. 3A is the same substrate that has been shown in FIG. 1F illustrating the Damascene process flow. The numbering used in FIG. 3A is analogous to the numbering used in FIG. 1F.

The substrate is a multi-layer Damascene structure with a trench 321 and a via 319 formed in the top two layers of inter-metal dielectric 315 and 311. The exposed surface of the wafer is coated with a copper diffusion barrier 323, which lines the substrate surface in the field and within the recesses. Diffusion barrier layer 323 is typically deposited by PVD methods and can be composed of materials such as Ta, $TaN_x$, $Ta/TaN_x$ bi-layer, Ti, W, their nitrides, and the like. Deposition of barrier layers is described, for example, in a commonly assigned U.S. patent application Ser. No. 11/588,586 filed on Oct. 26, 2006, naming Kailasam et al. as inventors, which is herein incorporated by reference for all purposes. In some embodiments, the presence of diffusion barrier layers may not be required, since certain seed layers may simultaneously perform a diffusion barrier function. For example, $Cu_xMn_y$, $Cu_xMg_y$, and $Cu_xAl_y$ alloys can be used as seed layers that do not require a separate diffusion barrier layer. In some embodiments, use of $Cu_xMn_y$ alloy is particularly preferred.

The substrate illustrated in FIG. 3A is the same substrate that has been shown in FIG. 1F illustrating the Damascene process flow. The numbering used in FIG. 3A is analogous to the numbering used in FIG. 1F.

The deposition of the first layer of metal in the seed layer as described in operation 201 of FIG. 2, can be accomplished under a variety of conditions in a number of deposition systems. Typically, the first layer of metal is deposited by PVD, e.g., by iPVD, but may also deposited by ALD methods, e.g., by iALD. A variety of iALD apparatuses may be used, when iALD is employed for the deposition of the first metal layer. ALD deposition of various materials including copper is described in detail, for example, in a commonly assigned U.S. application Ser. No. 11/498,949 filed on Aug. 2, 2006, naming Leeser et al. as inventors. This application is incorporated herein by reference in its entirety.

When PVD is used for deposition, the first layer of metal may be deposited in a PVD apparatus that includes a planar magnetron, or in a PVD apparatus that includes a three-dimensional target. For example a hollow cathode magnetron (HCM) configuration can be used. An INOVA™ tool commercially available from Novellus Systems, Inc. (San Jose, Calif.), which includes an HCM sputtering source, is an example of a suitable tool for such deposition.

When an iPVD apparatus is employed for deposition, the substrate, such as one depicted in FIG. 3A or FIG. 1F, is placed into the process chamber of an iPVD apparatus, and is subjected to conditions that result in a deposition of a layer of metal on the substrate surface.

In some embodiments, an inert gas, such as neon, krypton, argon or xenon, more typically argon, is introduced into the process chamber and is ionized in a plasma. The apparatus contains a target that is typically composed of the same metal that needs to be deposited on a substrate. For example, when copper seed layer is deposited, a copper target is used. When the seed layer contains a copper alloy, the necessary material is typically sputtered from a copper target which is doped with the required alloy component. Inert gas ions formed in a plasma are then directed towards the target and upon collisions with the target, sputtering of target metal occurs. The sputtered metal, which may be ionized or neutral, is deposited onto the exposed surfaces of a substrate forming a layer of metal.

Figure 4:
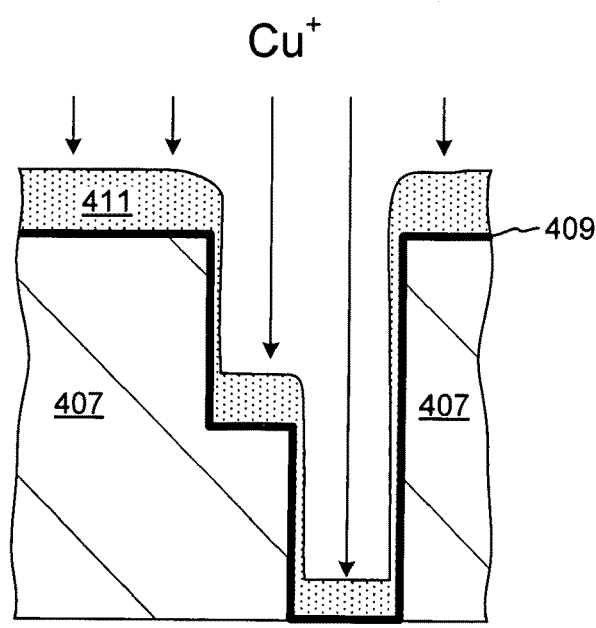
FIG. 4 illustrates a cross-sectional depiction of an interconnect, undergoing deposition using highly directional metal ion flux.

Depending on the desired result, deposition conditions may be adjusted to tune the amount of neutral or ionized metal during deposition and to tune the directionality of metal particles approaching the wafer. For example, in some embodiments, conditions may be adjusted to direct a flux of metal ions at a normal degree towards the wafer. The conditions may be further adjusted to minimize deposition effected by neutral metal particles, which usually do not have a preferred direction when they approach the substrate. When metal ions approach the substrate at 90° angle, horizontal surfaces, such as via bottoms, trench bottoms, and field regions are predominantly covered. Under such deposition conditions, the thickness of deposited metal layer is high on horizontal surfaces and is low on the sidewalls of the recessed features. These conditions also minimize undesired overhang at the recess openings. A cross-sectional depiction of a substrate undergoing deposition under these conditions is illustrated in FIG. 4. The substrate includes a via and a trench formed in a layer of dielectric 407. The surface of the wafer is lined with a layer of diffusion barrier material 409. A layer of copper is being deposited onto the exposed copper diffusion barrier. During deposition of the layer of copper, copper ions approach the substrate at a 90 degree angle and are deposited to form a layer of copper 411. It can be seen, that under these deposition conditions thickness of copper layer on the feature sidewalls is substantially smaller than the thickness of copper layer at the feature bottoms and in the field. Such deposition regime is often preferable, since it minimizes overhang formation. Advantages associated with such deposition regime and further details on deposition conditions are described in U.S. Pat. No. 6,642,146 naming Rozbicki et al. as inventors, issued on Nov. 4, 2003. This patent is herein incorporated by reference for all purposes.

In other embodiments, deposition of the first layer of metal may include a substantial amount of deposition effected by metal particles (neutral or ionized) that approach the substrate at angles other than 90°. When amount of such off-angle deposition is increased, the coverage of via bottoms is decreased, while deposition in the field, and in the low-aspect ratio features, such as on the sidewalls and bottoms of trenches is increased. In some embodiments, the first metal layer is deposited under conditions that can generate overhang at the openings of the recessed features. Such overhang can be subsequently removed and/or reshaped using metal redistribution, such as resputtering.

Generally, a wide range of conditions corresponding to a variety of deposition regimes, can be used during deposition of the first metal layer. For example, deposition can be performed under a pressure of between about 0.05 and 20 mTorr and at a wafer temperature of between about −50 to +75° C. In certain embodiments, it is preferable to use pressure that is less than about 1 mTorr. During deposition, the target power can be set within a range of between about 10 to 80 kW. The substrate may be biased or unbiased. The RF bias power may range from about 0 to 3000 W. It is understood, that different PVD systems may require different values of process parameters, and the above ranges are provided as an illustration of one embodiment. In other embodiments, temperature, pressure and power ranges may differ from those presented above. In those embodiments where increased coverage of via bottoms is desirable, the conditions are typically adjusted to increase the amount of highly directional metal particles approaching the wafer at 90° angle. According to some embodiments, such deposition conditions can be achieved using a target power that is set to a value ranging from about 35-75 kW, e.g., 50-75 kW, and an RF bias power ranging from about 100 W to 500 W. The preferred pressure used in this particular embodiment is less than about 1 mTorr. In other embodiments a highly directional metal flux may be achieved under different conditions, which depend on other parameters of the process, such as magnetic field, etc.

Figure 3B:
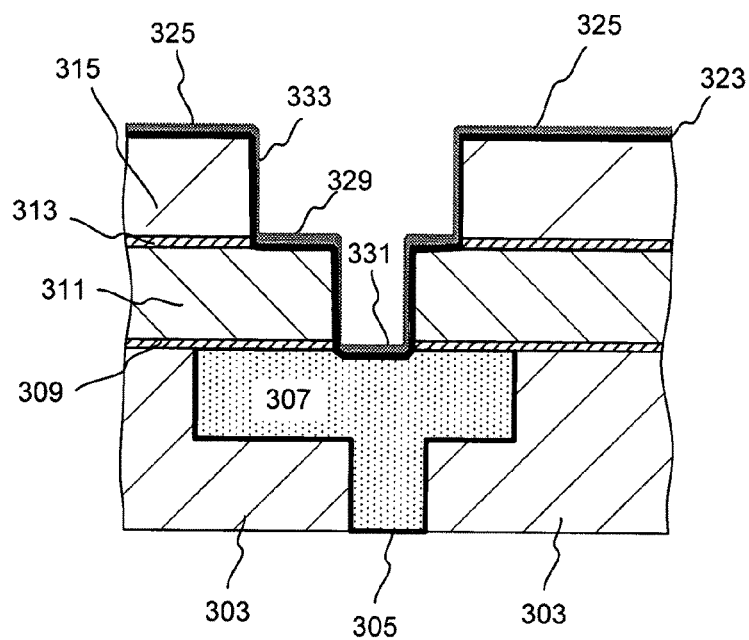
FIG. 3B shows a cross-sectional depiction of an interconnect illustrating deposition of a first metal layer.

The partially fabricated integrated circuit having a deposited first metal layer is illustrated in FIG. 3B. It can be seen that the layer of metal is deposited in the field 325, in the trench bottom 329, in the via bottom 331 and on the sidewalls 333. The thickness of the first metal layer deposited in the field can range from about 200 to 1000 Å, according to one example. In some embodiments, the thickness of the deposited first layer of metal on the bottom of recessed features (e.g., on the bottom of the trench 329 and on the bottom of the via 331) is between about 20 to 100% of the thickness of the first layer of metal deposited on the field (e.g., layer 325). Further, in some embodiments, the thickness of first metal layer deposited on the sidewalls (e.g., layer 333) is between about 10 to 20% of the thickness of the metal layer deposited in the field. The layer of metal on the sidewalls is typically very thin and needs to be improved by a subsequent redistribution operation. In other embodiments redistribution operation may be used to reduce and/or reshape overhang.

Redistribution of the First Layer of Metal

After the first layer of metal has been deposited, the redistribution operation 203 shown in FIG. 2, takes place. According to some embodiments, the first layer of metal is redistributed on the wafer from the bottom portions of the recessed features to the sidewalls of the recesses. The redistribution operation serves, in some embodiments, to improve seed layer coverage on the feature sidewalls. It may also be performed to reduce and/or reshape overhang, which sometimes forms at the openings of the recesses during deposition of the first metal layer. In some embodiments, such redistribution can be performed by resputtering and can be carried out in the same apparatus as the deposition of the first metal layer (e.g., in an iPVD apparatus). In other embodiments, deposition and redistribution of the first metal layer may be performed in different processing tools.

Resputtering involves removing material from a portion of the substrate by treating the substrate with ions formed in a plasma. A certain fraction of resputtered material may be re-deposited in other locations on the substrate. For example, material resputtered from the bottom of the via can be deposited on the via sidewalls and thus the thickness of the seed layer on the sidewalls can be increased. Resputtering may be effected by bombarding the substrate with inert gas ions formed in a plasma, e.g., by neon, argon, krypton, or xenon ions. Most typically, argon ions are used. In some embodiments, ionized metal may be used together with ionized gas for resputtering of wafer materials.

An important characteristic of resputter processes is the etch rate to deposition rate ratio (E/D). It should be understood, that both etching and depositing processes can occur simultaneously during resputter. Etching is the result of inert gas ions bombarding the wafer, while deposition is the result of inert gas ions bombarding the target, and sputtering target material (neutral or ionic) onto the wafer surface.

At the E/D ratio of 1 no net deposition or etching is occurring. At the E/D ratio of 0, the process is entirely depositing. At E/D ratios of more than 1 etching predominates, this being characteristic of resputter. The E/D ratio is not necessarily the same in different features of the wafer. For example, the E/D ratio in the field, in the trench, and in the via may have different values. These values usually correlate with the aspect ratio of the feature, being the largest in the highest aspect ratio recesses and decreasing as the aspect ratio decreases. Therefore, it is possible to have net deposition in the field region (E/D<1) and net etch at the via bottom (E/D>1). The resputter process in an iPVD context can be defined as a method which provides an E/D>1 in the bottom of the feature or features where resputtering is desired, e.g. the lowest lying feature on the wafer or in some cases the feature having the highest aspect ratio.

Figure 5:
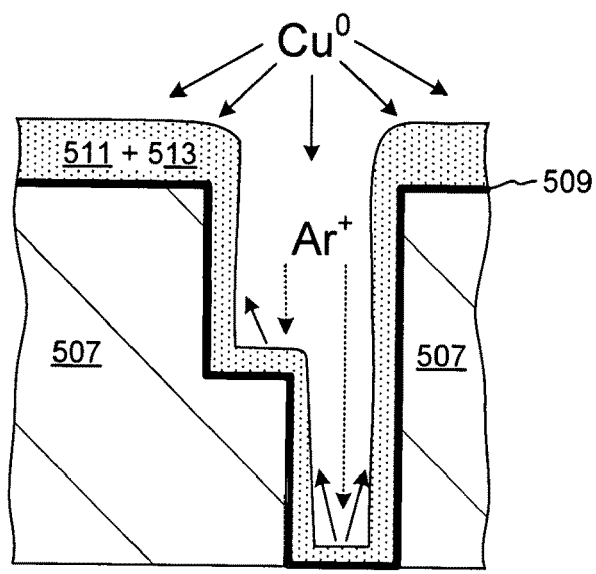
FIG. 5 illustrates a cross-sectional depiction of an interconnect, undergoing a resputter process having an etching and a deposition component.

Resputter process that includes an etch and a deposition component is illustrated in FIG. 5, in which a cross-sectional depiction of a partially fabricated integrated circuit undergoing resputter is presented. In this example, directional argon ions predominantly bombard the horizontal surfaces of the exposed copper layer 511, removing copper from these surfaces (etch component) and redistributing some of the copper from the bottom portions of the recesses onto their sidewalls. At the same time, neutral copper atoms are deposited from the target onto the exposed portions of copper layer 511 in a non-directional manner forming a copper sub-layer 513 (deposition component). Note that since deposition is effected by non-directional neutral copper atoms, deposition rates are typically greater in higher lying features of the substrate. For example the deposition rate on the field is typically greater than the deposition rate in the trench bottom, which is in turn greater than deposition rate at the via bottom.

In some embodiments, in order to achieve good sidewall coverage with a metal seed layer or an efficient overhang reduction, an aggressive resputtering process needs to be performed. It was surprisingly observed that an aggressive resputter, in some instances, results in significant improvement in sidewall coverage, when compared to milder resputtering, and is often a preferred method of metal redistribution. At the same time, aggressive resputter can cause an undesirable thinning of the seed layer at the horizontal surfaces of the substrate, e.g., in the field, and in the recess bottoms. Typically, aggressive resputter is characterized by high E/D ratios and by increased removal of material from certain portions of the wafer. According to some embodiments, resputtering operation involves net removal of metal from at least the bottom portions of the vias and/or trenches. For example, in some cases more than about 50% of metal is removed from the bottom portions of at least some of the recesses. Yet in another example of an aggressive resputter, the first layer of metal seed may be substantially removed from bottom portions of some recesses, e.g., from via bottoms, so that no more than about 5-10 Å of metal thickness remains at bottom portions of some recesses. Further, in some embodiments, resputtering may be so aggressive as to punch through the first layer of metal seed into an underlying copper diffusion barrier layer and, in some cases, even to remove some of copper diffusion barrier material, preferably without removing all the barrier material.

While such extensive etching at the recess bottoms is not normally desired, it inadvertently occurs when improved redistribution of material from recess bottoms to recess sidewalls is needed. In addition to removal of material from the recess bottoms, inadvertent etching at the field region also often occurs during aggressive resputter. Also, etching of the feature corners occurs, possibly down to the underlying barrier film. In some embodiments, more than about 20%, 40% or even 50% of metal is removed from the field region during resputtering operation. In some embodiments an E/D ratio of greater than about 2 is achieved in the field region.

Figure 3C:
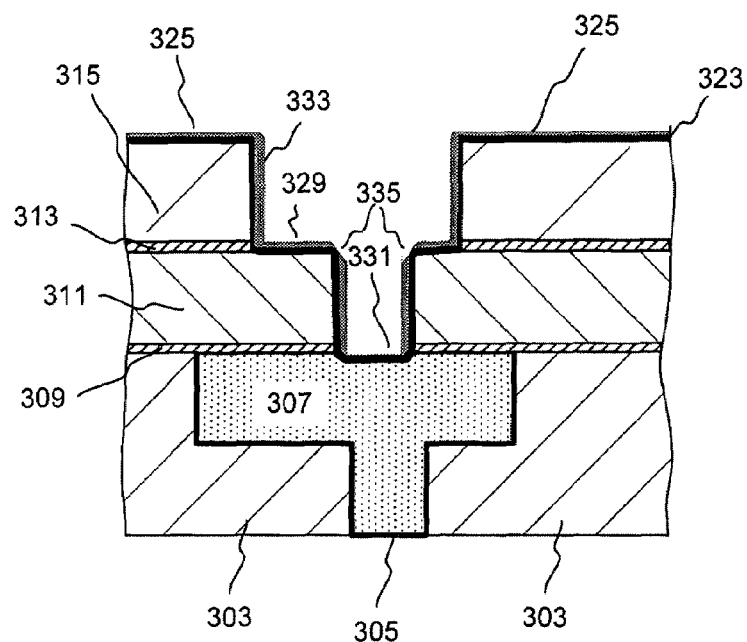
FIG. 3C shows a cross-sectional depiction of an interconnect illustrating redistribution of metal.

The etch and deposition processes can be controlled by modulating the power at the target and at the wafer pedestal. For example, to achieve high E/D ratio needed for resputter, the power at the target is decreased while the power at the wafer pedestal (bias) is increased. The lowering of DC power at the target reduces the deposition component and decreases plasma density, while increasing voltage on the wafer. Increasing RF bias power increases energy of the impinging ions and results in significant resputtering. Commonly employed DC target power for the resputter process is 1-8 kW, preferably 1-6 kW. The bias power for resputtering can range from about 100 to about 3000 W, preferably from about 600 to about 1500 W, and even more preferably from about 900 to about 1200 W. While aggressive resputter results in excellent sidewall coverage that may not always be attained by milder resputtering operations, it inadvertently creates several undesirable effects, which are illustrated in FIG. 3C. In a cross-sectional depiction of a partially fabricated IC, the coverage by a resputtered first layer of metal is shown. The thickness of the layer on the sidewalls 333 is substantially improved. However, thickness of the layer in the field 325, in the trench bottom 329, and particularly, in the via bottom 331 is decreased. In some cases thickness of the seed layer at the via bottom may be decreased to such extent that the seed layer will become discontinuous.

Aggressive resputtering operation, may also give rise to inadequate coverage at the corners located within the recesses. For example, the seed layer may be thin or discontinuous at the corner (shoulder) between the via and the trench. This is illustrated by chamfers 335 in FIG. 3C. Aggressive resputter may lead to removal of metal layer at certain corners within the recesses, giving rise to a cross-sectional profile in which these corners are "cut" at a 45° angle, as depicted in FIG. 3C.

Discontinuity of seed layer at the via bottoms or at the corners within the recesses is highly undesirable. When a subsequent electroplating operation is performed on a seed layer that has defects or discontinuous portions, the resulting electrofilled metal inlay may have voids at positions of seed layer defects. Such voids, e.g., voids located at via bottoms, can increase via chain resistance and can contribute to IC device failure. It is therefore preferable to perform electroplating on continuous seed layers.

It is also preferable to perform electroplating on seed layers that have a certain thickness, in order to avoid non-uniform deposition caused by the terminal effect, which was discussed above. Typically the seed layer has to be at least 50 Å thick in the field to allow substantially uniform plating. Therefore, the seed layer which may be thin or discontinuous at positions 325, 329, 331, and 335 shown in FIG. 3C, should be repaired to provide continuity and adequate thickness for plating.

Deposition of the Second Layer of Metal

The seed layer can be improved (e.g., "repaired") as shown in operation 205 of FIG. 2, by depositing a second layer of metal on at least the field region and on the bottom portions of the recessed features. Some deposition on the sidewalls can also be achieved. Deposition of the second layer of metal sometimes referred to as a "flash layer", can be performed in an apparatus and under the process conditions that were described above for deposition of the first layer of metal. For example an iPVD or an iALD process may be used for the flash layer deposition. While in some embodiments deposition of the second layer of metal is performed in the same apparatus and under the same conditions as deposition of the first layer, in other embodiments different deposition tools and different process conditions may be employed for the operations 201 and 205.

In some embodiments, all three operations, 201, 203, and 205 may be performed in one iPVD process chamber without breaking the vacuum. Process parameters for deposition of the first metal layer 201 and for deposition of the second layer 205 in this embodiment may be the same or may differ.

In some embodiments, the deposition conditions for the second layer are adjusted to achieve good coverage of the corners located within the recesses. This will allow repair of the seed layer on the chamfers when it is necessary. In these embodiments, deposition can be achieved by using a flux of metal ions or neutral particles that has a lower component of particles approaching the wafer at 90°.

While in general a wide variety of conditions can be used to deposit the second layer of metal (as described above for the first layer), the conditions that allow improved deposition on the chamfers typically include use of lower bias power and lower target power. During deposition under such conditions, the target power can be set within a range of between about 1.5-36 kW. The substrate may be biased or unbiased. The RF bias power when used for such deposition regime typically does not exceed 400 W. In one of the embodiments, deposition of the first layer of metal is performed under conditions that promote deposition by highly directional energetic metal ions, as shown in FIG. 4, while deposition of the second metal layer is performed under conditions that promotes deposition by metal ions or neutral atoms of lower energy and with higher non-directional component, such as those conditions described above for improved coating of chamfer regions.

Figure 3D:
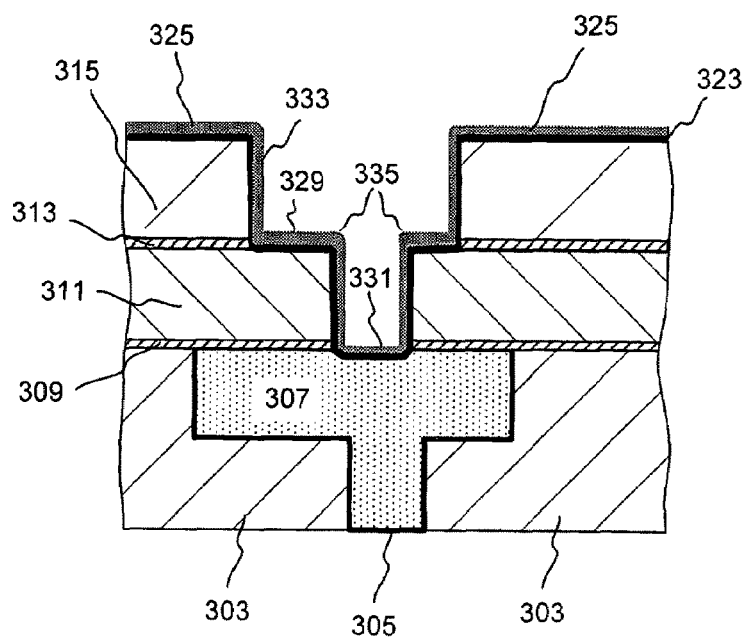
FIG. 3D shows a cross-sectional depiction of an interconnect illustrating deposition of a second metal layer.

In some embodiments, the second layer of metal is deposited to a thickness of between about 30-150 Å measured in the field. FIG. 3D illustrates a cross-sectional depiction of an IC structure, upon completion of deposition of a seed layer, according to methods described herein. It can be seen that after the second layer of metal has been deposited, the seed layer thickness in the field 325 is increased. Such increase in seed layer thickness allows minimization of terminal effect during subsequent electrofill operations. The bottom of the via 331 and the bottom of the trench 329 are adequately covered to ensure continuity and appropriate thickness of the seed layer. The seed layer coverage on the corners 335 located within the recesses is also substantially improved by deposition of the second metal layer on the exposed chamfer regions.

As a result, seed layer deposition methods described herein can afford continuous seed layers with improved coverage and optimal thickness in the field, in the recess bottoms, on the sidewalls and on the corners within recesses. This decreases the amount of defects during subsequent electroplating operations and leads to improved reliability of IC devices during end use.

Further, an additional advantage provided by certain embodiments of the described methods, is that the seed layer deposition sequence ends with a deposition step rather than with a resputter step. The "untouched" deposited metal layer often has better purity and overall quality, than a layer that has undergone resputtering. It is known that resputtering often leads to contamination of metal layers with inert gas atoms which are incorporated into the layers through inclusion processes. Such contamination can be diminished when the seed layer includes a top layer of pure deposited metal that has not undergone resputtering.

The seed layers deposited according to described methods generally exhibit good step coverage and, in some cases, excellent conformality. In some embodiments, the deposited seed layers may be nearly conformal (e.g., thickness at different surfaces of the wafer may not vary by more than about 10%). In other embodiments, the deposited seed layers are less conformal but are not necessarily inferior in quality. For example, devices having thick seed layer in the field and a thinner coverage on the sidewalls (e.g., about 20% of the field thickness) and recess bottoms (e.g., about 80% of the field thickness), can be produced by methods described above, and used in subsequent fabrication steps. Such disparity in thickness is not necessarily problematic, and may be preferred in some applications, as long as adequate coverage is achieved on all surfaces of the wafer. Adequate coverage value will vary for different technology nodes (feature sizes) and for different surfaces on the wafer. Generally seed layer thickness may range from about 200 Å to 1500 Å in the field. In specific examples, referring to particular technology nodes, seed layer thickness can range from about 800 Å to 1500 Å and from about 400 Å to 800 Å for 90 nm and 65 nm technology nodes respectively, as measured at the field.

Good seed layer step coverage achieved by these methods results in improved quality of electrofilled metal layer and, consequently, leads to improved parametric yield of the fabricated devices. Improved device reliability characteristics, such as electromigration, and stress migration characteristics, can also be possibly achieved by the provided methods.

Apparatus

While various embodiments of the present invention can be practiced in many different types of apparatus, two main types of iPVD apparatus, hollow cathode magnetron (HCM) and planar magnetron, will now be briefly described. Hollow cathode magnetron is an apparatus carrying a three-dimensional sputter target. The present invention is not limited to a specific cup-like geometry of an HCM target and can be used in conjunction with three-dimensional targets of a plurality of shapes.

Figure 6A:
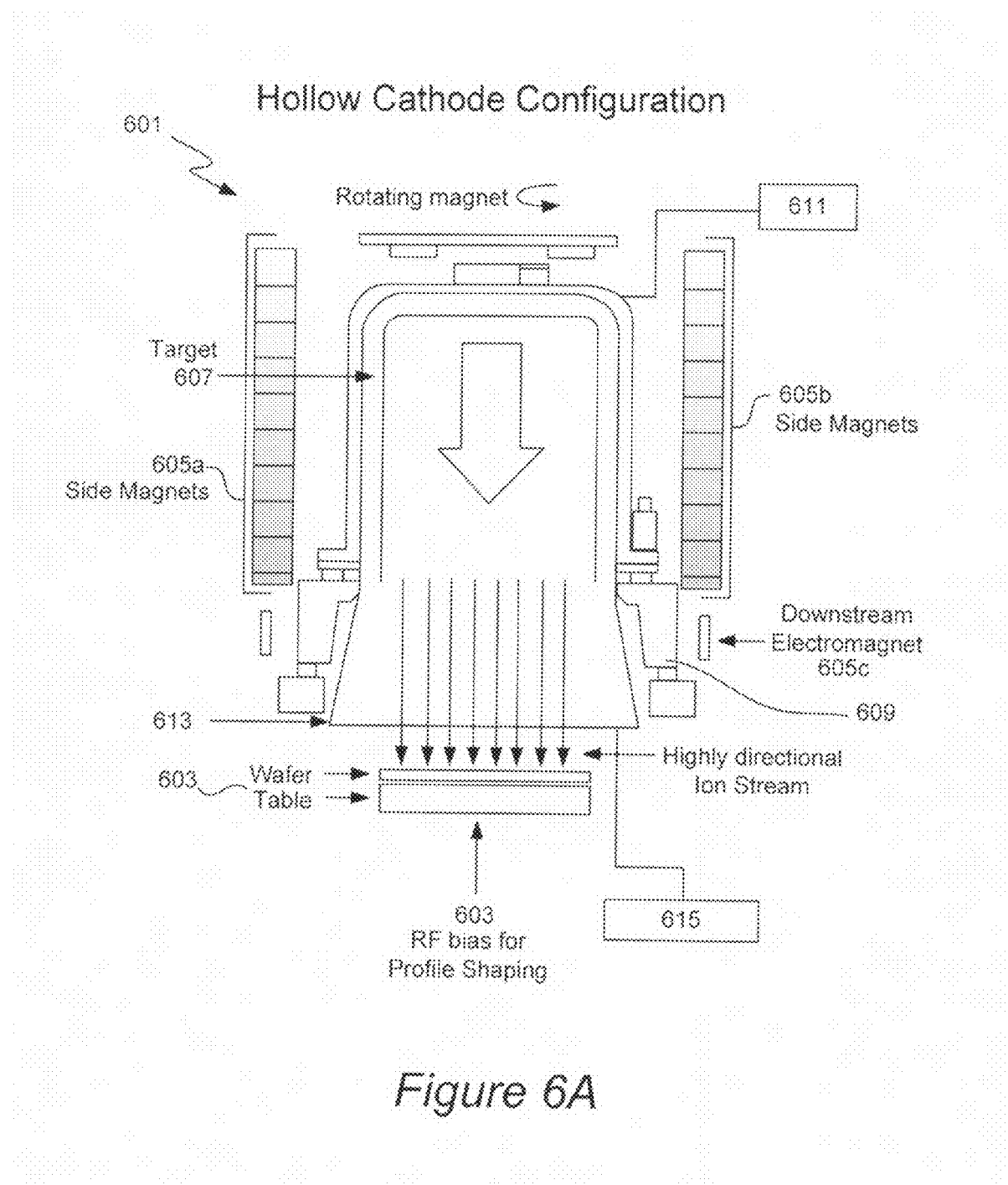
FIG. 6A is a cross sectional depiction of the hollow cathode magnetron (HCM) apparatus suitable for practicing the current invention.

FIG. 6A presents a cross sectional view of one type of HCM sputtering apparatus that can be used in accordance with the invention. The HCM apparatus has two main components, the source 601, in which a plasma is created and maintained, and the RF bias electrostatic chuck (ESC) pedestal 603, which secures the wafer and applies an RF bias on the wafer, if needed. In this example, the source 601 contains several electromagnets 605a-605c, a cathode target 607 and a shield 609, often referred to as an anode. The cathode target 607 generally has a hollow cup-like shape so that plasma formed in the source can be concentrated within this hollow region. The cathode target 607 also serves as a sputter target and is, therefore, made of a metal material such as copper, which is to be deposited onto a substrate.

An inert gas, such as argon, is introduced through a gas inlet 613 into the hollow region of the cathode target 607 powered by a DC source to form a plasma. The pump 615 is positioned to evacuate or partially evacuate the process chamber. The control of pressure in the process chamber can be achieved by using a combination of gas flow rate adjustments and pumping speed adjustments, making use of, for example, a throttle valve or a baffle plate. Alternatively, pressure above the wafer can be controlled by varying the height of the wafer pedestal 603. At an increased pedestal height, slower gas flow results in a higher pressure above the wafer. An intense magnetic field is produced by electromagnets 605a-605b within the cathode target region. Additional electromagnets 605c are arranged downstream of the cathode target so that different currents can be applied to each electromagnet, thereby producing an ion flux and a controlled deposition and/or etch rate and uniformity. A floating shield 609, existing in equilibrium with the floating plasma potential, is used, in conjunction with the source electromagnets to shape the plasma distribution at the target mouth. A stream of ions is directed to the surface of the wafer, as shown by arrows on FIG. 6A. The ESC pedestal 603 holds the wafer substrate in place and can apply a RF bias to the wafer substrate. The ion energy, and therefore the deposition and/or etch rate can also be controlled by the pedestal RF bias. An additional function of the ESC pedestal is to provide wafer temperature control during deposition and resputtering. In a typical process the pedestal temperature can vary in the range of about −50-600° C. In practice it is often advantageous to cool the wafer pedestal down to temperatures of about −40--20° C. while the shields of an apparatus are kept at a higher temperature of about 25-500° C., preferably 100-200° C. Typically, argon or helium backside gas is used to provide thermal coupling between the substrate and the ESC.

In certain embodiments, a system controller 611 is employed to control process conditions during deposition and resputter, insert and remove wafers, etc. The controller will typically include one or more memory devices and one or more processors. The processor may include a CPU or computer, analog and/or digital input/output connections, stepper motor controller boards, etc.

In certain embodiments, the controller controls all of the activities of the deposition apparatus. The system controller executes system control software including sets of instructions for controlling the timing, mixture of gases, chamber pressure, chamber temperature, wafer temperature, target power levels, RF power levels, wafer chuck or susceptor position, and other parameters of a particular process. Other computer programs stored on memory devices associated with the controller may be employed in some embodiments.

Typically there will be a user interface associated with controller 611. The user interface may include a display screen, graphical software displays of the apparatus and/or process conditions, and user input devices such as pointing devices, keyboards, touch screens, microphones, etc.

The computer program code for controlling the deposition and resputtering processes can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF bias power levels, DC target power levels, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck. A plasma control program may include code for setting DC and RF power levels applied to the process electrodes at the target and the wafer chuck.

Examples of chamber sensors that may be monitored during deposition and/or resputtering include mass flow controllers, pressure sensors such as manometers, and thermocouples located in pedestal or chuck. Appropriately programmed feedback and control algorithms may be used with data from these sensors to maintain desired process conditions.

The controller may provide program instructions for implementing the seed layer deposition method described above. The instructions may control a variety of process parameters, such as DC power level, RF bias power level, pressure, temperature, and magnetic field. The instructions may control the parameters so as to run a deposition/resputter/deposition sequence according to certain embodiments of the invention. For example, instructions may be provided for the following sequence: sputtering the metal from the target onto the semiconductor wafer under conditions that coat at least the bottom portions of the recessed features and the field regions; subsequently resputtering the deposited metal from the bottom portions of the recessed features to the sidewalls of the recessed features; and subsequently sputtering the metal from the target onto the semiconductor wafer to form a second layer of metal. In some embodiments the instructions may set the process parameters to remove at least about 50% of the metal layer thickness at the recess bottoms during the resputtering operations, or to remove about 20-50% of the metal layer thickness in the field. Further, the instructions may specify parameters that will lead to improved coating of corners located within the recessed features during deposition of the second layer of metal.

Figure 6B:
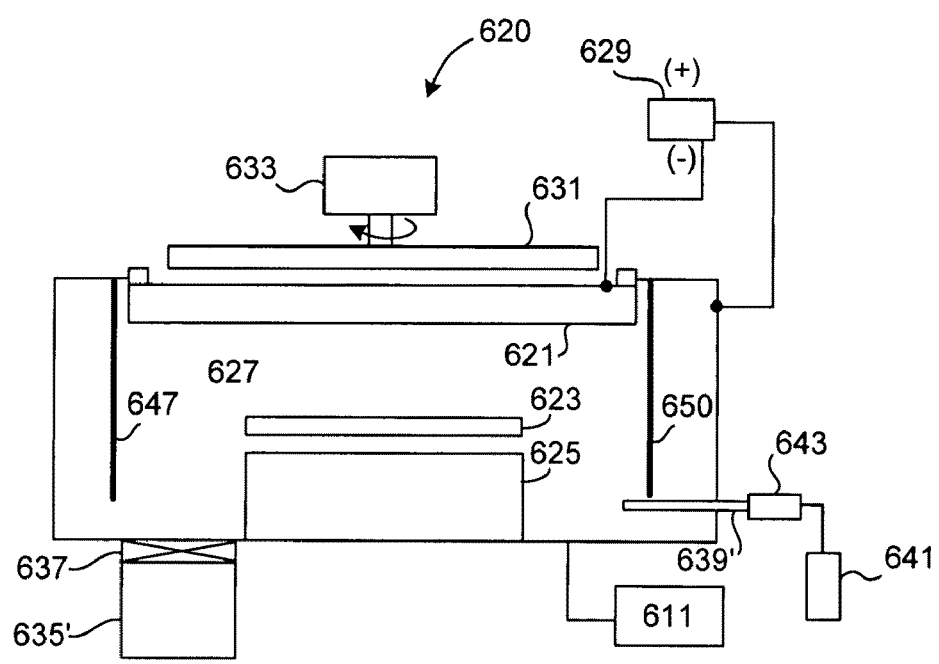
FIG. 6B is a cross sectional depiction of a planar magnetron suitable for practicing the current invention.

According to some embodiments of the invention, the seed layer can be deposited using a planar magnetron. FIG. 6B shows a schematic representation of an example planar magnetron 620. Target 621, a circular, planar block of material to be deposited, is spaced from the wafer 623, which is mounted on a heating stage 625 in chamber 627. A DC power supply 629 is used to apply a DC field to target 621, establishing a plasma in the chamber below target 621. A circular magnet 631 mounted above the target is rotated by motor 633 setting up a magnetic field extending through target 621 into the region between the target 621 and wafer 623. Cryopump 635 connected to chamber 627 via valve 637 is used to evacuate the chamber. Process gas injector 639 is connected to process gas supply 641 via mass flow controller 643. A sputtering gas is introduced into chamber 627 via injectors 639. It is understood that the structure of module 620 is exemplary only. The methods of present invention may be practiced in other types of planar magnetrons, such as ones having ICP sources.

EXAMPLES

Figure 7:
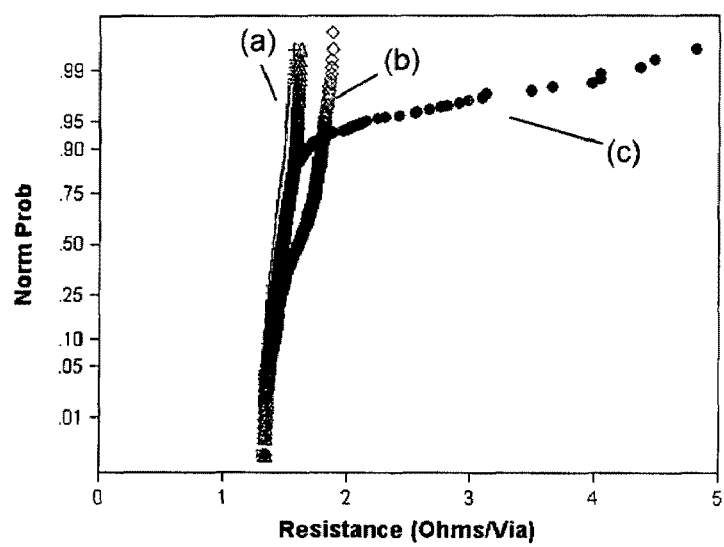
FIG. 7 is an experimental plot illustrating via resistance observed with different copper seed deposition methods.

The methods of present invention have been evaluated experimentally. FIG. 7A presents an experimental plot that illustrates probability of device having a particular via chain resistance for devices fabricated using three different seed layer formation methods. Curve (a) illustrates the devices, fabricated using a deposition-resputter-deposition seed layer formation sequence provided by methods described herein. Curve (b) corresponds to devices fabricated using a deposition-resputter two-step seed layer formation method, and curve (c) corresponds to devices fabricated using a one-step deposition only method.

It can be seen that parametric performance of devices fabricated using deposition/resputter/deposition method, illustrated by curve (a), is superior to the performance of devices fabricated using other methods. Thus, only minor variation in via chain resistance is observed in the devices illustrated by curve (a). At the same time, the probability of device formation with a small but significant increase in via resistance of about 0.3 Ohms/Via is greater than 50% for devices fabricated using a two-step seed layer deposition method (curve (b)). Devices that were fabricated using a one-step deposition process (curve (c)) show a very wide distribution of resistance parameters. In this case, formed devices have a greater than 5% probability of having an unacceptably high via resistance of greater than 3 Ohms/Via. It can be seen that parametric yield, which correlates with parametric performance is greatest for devices fabricated using deposition/resputter/deposition method (curve (a)).

Figure 8A:
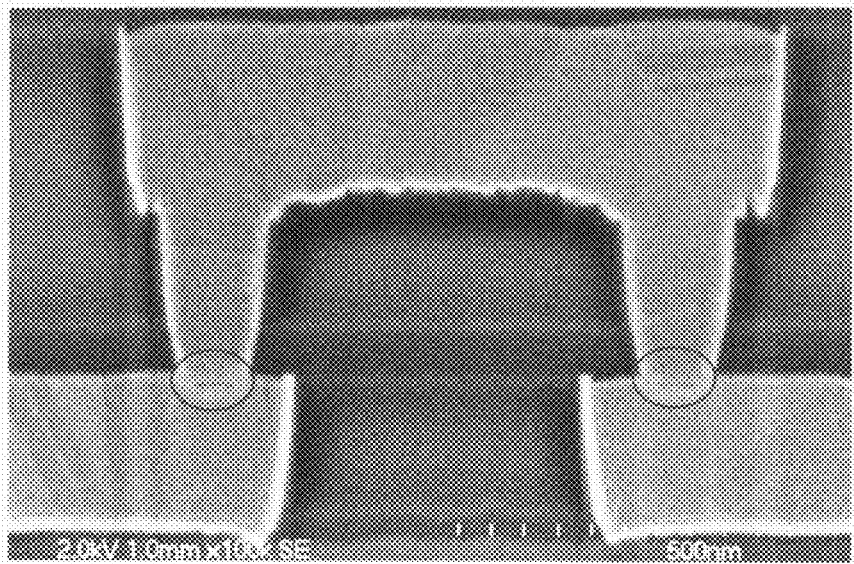
FIG. 8A represents experimental data showing SEM photograph of a device cross-section illustrating defects in an interconnect fabricated by a deposition/resputter method.
Figure 8B:
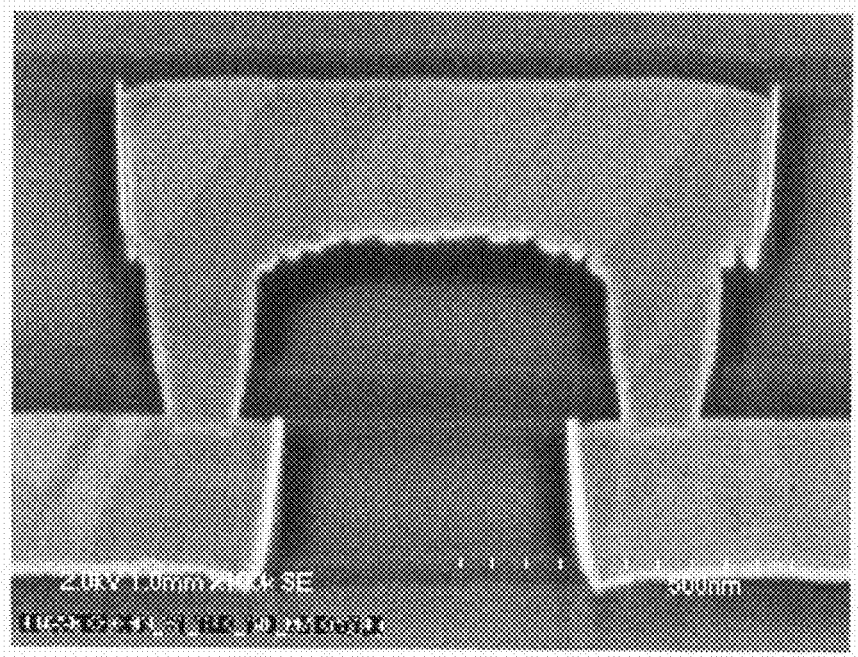
FIG. 8B represents experimental data showing SEM photograph of a device cross-section illustrating absence of defects in an interconnect fabricated by a deposition/resputter/deposition method.

Small but significant increase in via chain resistance observed in devices obtained using a two-step deposition/resputter seed formation process, is, in part, due to formation of voids at the via bottoms of the device. The voids can be formed, when copper electrofill is performed on discontinuous or otherwise defective copper seed layers generated by aggressive resputter. These voids can be visualized using SEM techniques. FIG. 8A is an SEM photograph of a device cross-section, illustrating voids in a device fabricated by a deposition/resputter process. Two landed vias electrofilled with copper are shown. The regions containing voids are circled, with the voids appearing as darker horizontal lines within these regions. For a comparison, an analogous SEM photograph of a device fabricated using a deposition/resputter/deposition method is shown in FIG. 8B. It can be seen that voids are absent in this interconnect.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of depositing a metal seed layer on a wafer substrate having recessed features and a field region, the method comprising:
   (a) depositing a first layer of metal onto the wafer substrate by sputtering a metal using ionized physical vapor deposition (iPVD), wherein the deposited first layer forms a thick layer on the bottom portions of the recessed features and on the field region, while forming a substantially thinner layer on the sidewall portions of the recessed features, and while forming substantially no overhangs at the openings of the recessed features;
   (b) subsequently etching the first metal layer from the bottom portions of the recessed features while redistributing the first metal layer to the sidewall portions of the recessed features to increase the thickness of the first metal layer on the sidewall portions of the recessed features, wherein said etching removes more than 50% of the first layer of metal from the bottom portions of at least some of the recessed features; and
   (c) after redistributing the deposited metal, depositing a second layer of metal by sputtering a metal using ionized physical vapor deposition (iPVD) to coat inadequately coated regions on the wafer substrate, wherein the method provides a continuous metal seed layer having a thickness suitable for subsequent electroplating thereon.

2. The method of claim 1, wherein the metal seed layer is a copper or copper alloy seed layer.

3. The method of claim 2, wherein the copper alloy seed layer comprises an alloying material selected from the group consisting of Mn, Mg, Al, Sn, Zn, Ag, Ta, and B.

4. The method of claim 1, wherein the recessed features include vias and/or trenches.

5. The method of claim 1, further comprising:
   (d) redistributing metal on the wafer after (c); and
   (e) after redistributing the metal in (d), depositing a third layer of metal on at least the field region and the bottom portions of the recessed features.

6. The method of claim 5, further comprising repeating (d) and (e) at least once.

7. The method of claim 1, further comprising redistributing metal on the wafer after (c).

8. The method of claim 1, wherein operation (b) comprises resputtering the first layer with plasma.

9. The method of claim 1, wherein operations (a), (b), and (c) are performed in one process chamber.

10. The method of claim 9, wherein the process chamber comprises a hollow cathode magnetron (HCM).

11. The method of claim 9, wherein the process chamber comprises a planar magnetron.

12. The method of claim 1, wherein operation (a) comprises depositing the first layer of metal on the field region and on the sidewalls, wherein the thickness of the deposited first layer on the bottom of the recessed features is between about 20 to 100% of the thickness of the first layer deposited on the field; and wherein the thickness of the deposited first layer on the sidewalls of the recessed features is between about 10 to 20% of the thickness of the first layer deposited on the field.

13. The method of claim 12, wherein the thickness of the first layer deposited in the field is between about 200 and 1000 Å.

14. The method of claim 1, wherein (a) comprises depositing the first metal layer on a layer of diffusion barrier material.

15. The method of claim 1, wherein the pressure used in step (a) is less than about 1 mTorr.

16. The method of claim 1, wherein operation (b) further comprises etching material from the field region.

17. The method of claim 16, wherein operation (b) comprises etching more than about 20% of the first metal layer from the field region.

18. The method of claim 16, wherein operation (b) comprises etching more than about 40% of the first metal layer from the field region.

19. The method of claim 16, wherein operation (b) comprises depositing metal on the field region while simultaneously removing metal from the field region, wherein an etch rate to deposition rate (E/D) ratio in the field region is greater than about 2.

20. The method of claim 1, wherein operation (b) comprises removing the first layer of metal from the bottom portions of at least some of the recesses such that no more than about 5 Å of the first layer of metal remains in the bottom portions of said recesses.

21. The method of claim 1, wherein the second layer of metal is deposited to a thickness of about 30-150 Å in the field region.

22. The method of claim 1, wherein depositing the first layer of metal comprises providing a first power level to a PVD target and a first RF power level to the substrate and wherein depositing the second layer of metal comprises providing a lower power level to the target and no RF power or a lower RF power level to the substrate whereby depositing the second layer of metal promotes coverage of corners within the recessed features.

* * * * *